(12) United States Patent
Matsumoto et al.

(10) Patent No.: US 6,919,159 B2
(45) Date of Patent: Jul. 19, 2005

(54) PHOTOPOLYMERIZABLE COMPOSITION AND RECORDING MATERIAL USING THE SAME

(75) Inventors: Hirotaka Matsumoto, Shizuoka-ken (JP); Shintaro Washizu, Shizuoka-ken (JP); Kazunori Nigorikawa, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 208 days.

(21) Appl. No.: 10/265,102

(22) Filed: Oct. 7, 2002

(65) Prior Publication Data

US 2003/0129523 A1 Jul. 10, 2003

(30) Foreign Application Priority Data

Oct. 5, 2001 (JP) ........................................ 2001-309358

(51) Int. Cl.$^7$ .............................................. G03F 7/004
(52) U.S. Cl. .................. 430/270.1; 430/138; 430/281.1; 430/292; 430/917; 430/913; 430/914
(58) Field of Search .............................. 430/138, 281.1, 430/270.1, 292, 917, 913, 914

(56) References Cited

U.S. PATENT DOCUMENTS

| | | |
|---|---|---|
| 5,124,236 A | 6/1992 | Yamaguchi et al. |
| 6,022,664 A * | 2/2000 | Washizu et al. ............ 430/138 |
| 6,218,076 B1 * | 4/2001 | Ogata et al. ............ 430/281.1 |
| 6,562,543 B2 * | 5/2003 | Ogata et al. ............ 430/281.1 |

FOREIGN PATENT DOCUMENTS

| | | | | |
|---|---|---|---|---|
| JP | 57-124343 | 8/1982 | | |
| JP | 57-179836 | 11/1982 | | |
| JP | 57-197538 | 12/1982 | | |
| JP | 61004038 A * | 1/1986 | ............ | G03C/1/68 |
| JP | 64-013144 | 1/1989 | | |
| JP | 3-87827 | 4/1991 | | |
| JP | 4-211252 | 8/1992 | | |

OTHER PUBLICATIONS

English language abstract of JP 61–004038.*

* cited by examiner

*Primary Examiner*—Amanda Walke
(74) *Attorney, Agent, or Firm*—Young & Thompson

(57) ABSTRACT

The present invention provides a photopolymerizable composition, which is highly sensitive to visible light rays to IR rays and has an excellent raw storage property, and a recording material capable of carrying out highly sensitive image recording and having an excellent raw storage property and humidity dependency. Namely, the invention provides a photopolymerizable composition containing at least a polymerizable compound having an ethylenic unsaturated bond, a photoradical generating agent, and a thiol compound represented by the following general formula (I) and a recording material using the photopolymerizable composition:

General formula (I)

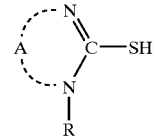

[R represents an alkyl or an aryl, either of which may have substituents; A represents an atom group forming a 5-member or 6-member heteroring having an N=C—N portion and carbon atoms and A may further have a substituent group.].

12 Claims, No Drawings

PHOTOPOLYMERIZABLE COMPOSITION AND RECORDING MATERIAL USING THE SAME

BACKGROUND OF THE INVENTION

1. Field of the Invention

The present invention relates to a photopolymerizable composition and a recording material, more particularly to a photopolymerizable composition and a recording material, which are preferably usable in a wide range of fields such as a cyanine-based organic dyes, inks, color filters, holograms, proofs, sealing agents, adhesives, planographic printing, resin relief printing plates, photoresists and the like.

2. Description of the Related Art

The photopolymerizable composition basically contains a photopolymerization initiator and an addition-polymerizable compound (hereinafter referred to as polyfunctional monomer) having two or more ethylenic unsaturated bonds in a molecule. The photopolymerizable composition is cured by light radiation, has change of viscosity, and becomes insoluble in solvents. To utilize these characteristics, the composition is widely used for photography, printing, metal surface processing, ink and the like. The functions and the application examples of the photopolymerizable composition are described in many published printed matter.

For example, detailed descriptions are given in J. Kosar, *Light Sensitive Systems* (New York: J. Wiley and Sons, 1965) pp. 158–193; and K. I. Jacobson and R. E. Jacobson, *Imaging Systems* (New York: J. Wiley and Sons 1976) pp. 181–222; and the like.

Further, as an image forming method using a photopolymerizable composition, an image forming system using a photosensitive microcapsule encapsulating a photopolymerizable composition has been proposed recently. For example, Japanese Patent Application Laid-Open (JP-A) Nos. 57-124343, 57-179836, and 57-197538 disclose color image formation methods comprising steps of laminating a color formation sheet, which is coated with a microcapsule that enencapsulates a dye and a photopolymerizable composition that contains a vinyl compound and a photopolymerization initiator, and an image receiving sheet after exposure and applying pressure to the whole body.

Further, JP-A Nos. 3-87827 and 4-211252 describe photosensitive and heat-sensitive color recording material containing two components and disclose recording materials, in which one of two components is enencapsulated in a microcapsule and the other component is either a curable compound of a photo curable composition or is included together with a photo curable composition outside of the microcapsule. Further, in the latter recording material, a photosensitive and heat-sensitive recording material is exemplified which has a layer containing a microcapsule enencapsulating an electron-donating colorless dye and, the outside of the microcapsule, a photo curable composition containing an electron-accepting compound, a polymerizable vinyl monomer, and a photopolymerization initiator.

As described above, the recording material utilizing the photopolymerizable composition is capable of image recording in a completely dry system without using a developing solution or the like and is thus remarkably preferable with regard to the environments in that no waste is discharged.

In the case of an image recording, which uses a photosensitive recording material, it is advantageous if the photosensitive recording material can use not only UV rays and short wave visible light rays but also economical IR laser and blue to red color rays. However, when the recording material uses the photopolymerizable composition, the recording material may be sensitive to UV rays but insensitive to visible light rays to IR rays or even if sensitive to them, the sensitivity may not be sufficient in many cases and consequently, the formed images may become unclear or the contrast between an image area and a non-image area may be low in and higher sensitivity is desired.

On the other hand, inventors of the invention have proposed a compound having a thiol group for a polymerization auxiliary agent as a photopolymerizable composition usable for the recording material mentioned above and have solved the problems of the sensitivity improvement and the sensitivity to a light source for visible light rays or higher (JP-A No. 64-13144). However, if the photopolymerizable composition is applied to a recording material, for example, in the case when a vinyl sulfone type film curing agent is used in a gelatin binder system, the foregoing polymerization auxiliary agent sometimes reacts with the film curing agent to result in deterioration of storage stability and alteration of the photosensitivity based on the humidity, thus further improvements still remain to be done.

SUMMARY OF THE INVENTION

An object of the present invention aims to solve above-mentioned conventional problems and achieve the following purposes.

That is, an object of the invention is to provide a photopolymerizable composition which responds with a high sensitivity to not only UV rays but also visible light rays to IR rays and has excellent raw storage property.

Further, an object of the invention is to provide a recording material having an excellent raw storage property and humidity dependency and capable of highly sensitive image recording using not only UV rays but also visible light rays to IR rays in a processing system, which is completely dry and does not require use of a developing solution, or the like, or generate no waste.

The means for solving the above-mentioned problems are as follows.

That is, according to one aspect of the invention, there is provided a photopolymerizable composition containing at least a polymerizable compound having an ethylenic unsaturated bond, a photoradical generating agent, and a thiol compound represented by the following general formula (I):

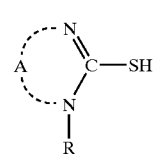

General formula (I)

In the general formula (I), R represents an (un)substituted alkyl or an (un)substituted aryl; A represents an atom group forming a 5-member or 6-member heteroring having an N=C—N portion and carbon atoms and A may further have a substituent group.

Further, according to another aspect of the invention, there is provided the above-mentioned photopolymerizable composition wherein the thiol compound represented by the above-mentioned general formula (I) is a thiol compound represented by the following general formula (II):

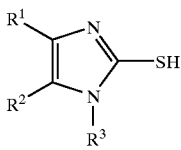

General formula (II)

In the general formula (II), $R^1$ and $R^2$ independently represent hydrogen atom, an (un)substituted alkyl, or an (un)substituted aryl; the alkyl and the aryl may be bonded to each other to form a ring. $R^3$ represents an (un)substituted alkyl, or an (un)substituted aryl.

Further, according to still another aspect of the invention, there is provided the above-mentioned photopolymerizable composition, wherein the composition further contains at least one compound selected from a group of an organic boron compound, a lophin dimer compound, a trihalomethyl compound, an azinium salt compound, and an acylphosphine oxide compound.

Further, according to still another aspect of the invention, there is provided the above-mentioned photopolymerizable composition wherein the organic boron compound is a compound represented by the following general formula (A):

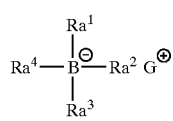

General formula (A)

In the general formula (A), $R_a^1$, $R_a^2$, $R_a^3$, and $R_a^4$ independently represent an aliphathic group, an aromatic group, a heterocyclic group or $Si(R_a^5)(R_a^6)$—$R_a^7$, and $R_a^5$, $R_a^6$, and $R_a^7$ independently represent an aliphatic group or an aromatic group. $G^+$ represents a group forming a cation.

Further, according to still another aspect of the invention, there is provided a recording material having a recording layer on a substrate, wherein the recording layer contains the above-mentioned photopolymerizable composition.

Further, according to still another aspect of the invention, there is provided a recording material having a recording layer on a substrate, wherein the recording layer contains at least a color-forming component A, a color-forming component B having a site for color formation by reaction with the color-forming component A and the above-mentioned photopolymerizable composition.

Further, according to still another aspect of the invention, there is provided the above-mentioned recording material, wherein the color-forming component B is at least one of polymerizable compounds having an ethylenic unsaturated bond.

Further, according to still another aspect of the invention, there is provided the above-mentioned recording material wherein the polymerizable compound having the ethylenic unsaturated bond is a color formation suppressing compound having a site for suppressing the reaction of the color-forming components A and B in a single molecule.

Further, according to still another aspect of the invention, there is provided the above-mentioned recording material, wherein the color-forming component A is enencapsulated in a microcapsule.

Further, according to still another aspect of the invention, there is provided the above-mentioned recording material having a multi-layer structure composed of a first recording layer photosensitive to light with a center wavelength of $\lambda_1$, a second recording layer photosensitive to light with a center wavelength of $\lambda_2$ and color formation with a different color from that of the first recording layer, . . . and a ith recording layer photosensitive to light with a center wavelength of $\lambda_i$ and color formation with a different color from those of the first, the second, . . . , and (i–1)th recording layers.

DETAILED DESCRIPTION OF THE PREFERED EMBODIMENT

A photopolymerizable composition of the present invention includes at least a polymerizable compound having an ethylenic unsaturated bond, a photoradical generating agent, and a thiol compound represented by the following general formula (I). Further, in a recording material of the invention, a recording layer on a substrate comprises the above-mentioned photopolymerizable composition together with a color-forming component.

Hereinafter, the photopolymerizable composition of the invention will be described and the details of the recording material will be made clear through the descriptions.
Photopolymerizable Composition:

The photopolymerizable composition of the invention comprises at least a polymerizable compound having an ethylenic unsaturated bond, a photoradical generating agent, and a thiol compound represented by the following general formula (I) as a polymerization auxiliary agent. If necessary, the photopolymerizable composition may further contain other components.
Polymerizable Compound Having an Ethylenic Unsaturated Bond:

The photopolymerizable composition of the invention contains a polymerizable compound having an ethylenic unsaturated bond (hereinafter, sometimes referred to as a polymerizable compound).

The above-mentioned polymerizable compound is a polymerizable compound having at least one ethylenic unsaturated double bond in a molecule. Examples of the polymerizable compound are not particularly limited and can be appropriately selected depending on the purposes, and include acrylic acid derivatives such as acrylic acid esters, acrylamides, and the like; acrylic acid and salts thereof; methacrylic acid derivatives such as methacrylic acid esters, methacrylamides and the like; methacrylic acid and its salts; maleic anhydride; maleic acid esters; itaconic acid: itaconic acid esters; styrenes; vinyl ethers; vinyl esters; N-vinyl heterocyclic compounds; allyl ethers; allyl esters and the like.

The above-mentioned polymerizable compound may include one or more olefinic double bonds and have a low molecular weight (monomer property) or a high molecular weight (oligomer property).

Examples of the monomer having a double bond include alkyl or hydroxyalkyl acrylates or methacrylates such as methyl acrylate, ethyl acrylate, butyl acrylate, 2-ethylhexyl acrylate, 2-hydroxyethyl acrylate, isobornyl acrylate, methyl methacrylate, and ethyl acrylate. Silicon acrylate is also advantageous.

Other examples include acrylonitrile, acrylamide, methacrylamide, N-substituted (meth)acrylamide, a vinyl ester such as vinyl acetate, a vinyl ether such as isobutyl vinyl ether, styrene, alkyl- and halo-styrene, N-vinylpyrrolidone, vinyl chloride and vinylidene chloride.

Examples of the monomer containing two or more double bonds include diacrylates of ethylene glycol, proplylene glycol, neopentyl glycol, hexamethylene glycol and bisphenol A; 4,4'-bis(2-acryloyloxyethoxy)diphenyl propane, trimethylolpropane triacrylate, pentaerythritol triacrylate or tetraacrylate, vinyl acrylate, divinylbenzene, divinyl succinate, diallyl phthalate, triallyl phosphate, triallyl isocyanurate, tris(2-acryloylethyl)isocyanurate, and the like.

Examples of the multi-unsaturated compound of a relatively high molecular weight (oligomer property) include (meth)acryl-containing epoxy resins, (meth)acryl-containing polyesters, vinyl ether- or epoxy group-containing polyesters, polyurethanes, and polyethers. Further, examples of the unsaturated oligomer include unsaturated polyester resin generally produced from maleic acid, phthalic acid, and one or more diols and having a molecular weight of about 500 to 3,000. Additionally, vinyl ether monomers and oligomers, and oligomers having polyesters, polyurethanes, polyethers, polyvinyl ethers, and epoxy groups as main chains and terminated with maleate may be employed. Especially suitable examples are combinations of oligomers having vinyl ethers and polymers described in WO90/01512. Further, copolymers of vinyl ether and monomers provided with a maleic acid functional group are also suitable. Such kinds of unsaturated oligomers can be employed as prepolymers.

Especially preferable examples are esters of ethylenic unsaturated carboxylic acids with polyols or polyepoxides, polymers having ethylenic unsaturated groups in the main chain or a side chain such as unsaturated polyesters, polyamides, and polyurethanes and their copolymers, alkid resins, polybutadiene, butadiene copolymers, polyisoprene, isoprene copolymers, polymers and copolymers containing (meth)acryl in the side chain and mixtures of one or more of such polymers.

Examples of the unsaturated carboxylic acids include unsaturated fatty acids such as acrylic acid, methacrylic acid, crotonic acid, itaconic acid, cinnamic acid, linoleic acid and oleic acid. Among these, acrylic acid and methacrylic acid are preferable.

Suitable polyols are aromatic and particularly aliphatic and alicyclic polyols.

Examples of the aromatic polyols include hydroquinone, 4,4'-dihydroxydiphenyl, 2,2-di(4-hydroxyphenyl)propane, novolak, and resorcin. Examples of the polyepoxide are those containing the above-mentioned polyols, particularly aromatic polyols and epichlorohydrine as a base. Suitable polyols other than these examples are polymers and copolymers containing hydroxyl in the polymer chain or the side chain and examples thereof include polyvinyl alcohol and its copolymers, and polyhydroxylalkyl methacrylate and copolymers thereof. Further preferable polyols are oligoesters having hydroxy terminal groups.

Examples of the aliphatic and alicyclic polyols include alkylene diols preferably having 2 to 12 carbon atoms such as ethylene glycol, 1,2- or 1,3-propenediol, 1,2-, 1,3- or 1,4-butanediol, pentanediol, hexanediol, octanediol, dodecanediol, diethylene glycol, and triethylene glycol; preferably polyethylene glycol having 200 to 1,500 molecular weight, 1,3-cyclopentanediol, 1,2-, 1,3-, or 1,4-cyclohexanediol, 1,4-dihydroxymethylcyclohexane, glycerol, tris(β-hydroxyethyl)amine, trimethylolethane, trimethylolpropane, pentaerythritol, dipentaerythritol and sorbitol.

Polyols can be partially or completely esterified with one kind of carboxylic acid or different unsaturated carboxylic acids and in the partially esterified compounds, free hydroxyl may be modified and, for example, etherified or esterified with other carboxylic acids.

Examples of the esters are as follows. That is, trimethylolpropane triacrylate, trimethylolethane triacrylate, trimethylolpropane trimethacrylate, trimethylolethane trimethacrylate, tetramethylene glycol dimethacrylate, triethylene glycol dimethacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol pentaacrylate, dipentaerythritol hexaacrylate, tripentaerythritol octaacrylate, pentaerythritol dimethacrylate, pentaerythritol trimethacrylate, dipentaerythritol dimethacrylate, dipentaerythritol tetramethacrylate, tripentaerythritol octamethacrylate, pentaerythritol diitaconate, dipentaerythritol trisitaconate, dipentaerythritol pentaitaconate, dipentaerythritol hexaitaconate, ethylene glycol diacrylate, 1,3-butanediol diacrylate, 1,3-butanediol dimethacrylate, 1,4-butanediol diitaconate, sorbitol triacrylate, sorbitol tetraacrylate, pentaerythritol-modified triacrylate, sorbitol tetramethacrylate, sorbitol pentaacrylate, sorbitol hexaacrylate, oligoester acrylate, and methacrylate, glycerol diacrylate, and triacrylate, 1,4-cyclohexane diacrylate, bisacrylate and bismethacrylate of polyethylene glycol with a molecular weight of 200 to 1,500 and their mixtures.

Further, those suitable for the above-mentioned polymerizable compound are amides of a single or different unsaturated carboxylic acid and aromatic, alicyclic and aliphatic polyamine having preferably 2 to 6, and more preferably 2 to 4 amino groups.

Examples of these polyamines include ethylenediamine, 1,2- or 1,3-propylenediamine, 1,2-, 1,3-, or 1,4-butylenediamine, 1,5-pentylenediamine, 1,6-hexylenediamine, octylenediamine, dodecylenediamine, 1,4-diaminocylohexane, isophoronediamine, phenylenediamine, bisphenylenediamine, di-β-aminoethyl ether, diethylenetriamine, triethylenetetramine, and di(β-aminoethoxy) or di(β-aminopropoxy)ethane. In addition to these examples, polymers and copolymers further having amino groups preferably in the side chain and oligoamides having an amino-terminal group are preferable. Examples of these unsaturated amides include methylene bisacrylamide, 1,6-hexamethylene bisacrylamide, diethylene triamine trismethacrylamide, bis(methacrylamidopropoxy)ethane, β-methacrylamidoethyl methacrylate, and N-[(β-hydroxyethoxy)ethyl]acrylamide.

Suitable unsaturated polyesters and polyamides, for example, can be derived from maleic acid in combination with diols or diamines. A portion of maleic acid can be replaced with another dicarboxylic acid. They may be used in combination with an ethylenic unsaturated co-monomer, such as styrene. The polyesters and polyamides can be derived from dicarboxylic acids in combination with ethylenic unsaturated diols and diamines and particularly from those with a relatively long chain, for example, having 6 to 20 carbon atoms. Examples of polyurethanes include those derived from saturated or unsaturated diisocyanates and unsaturated or respectively saturated diols.

Polybutadiene and polyisoprene and their copolymers are known well. Examples of suitable co-monomers are olefins such as ethylene, propene, butene, hexene, (meth)acrylate, acrylonitrile, styrene or vinyl chloride. Polymers having (meth)acrylate in the side chain are also well known. For example, the polymers can be obtained as reaction products of novolak-based epoxy resin and (meth)acrylic acid or may be homo- or copolymers of vinyl alcohol or hydroxyalkyl derivatives obtained by esterification with (meth)acrylic acid or may be homo- or copolymers of (meth)acrylate obtained by esterification with hydroxyalkyl (meth)acrylate.

The above-mentioned polymerizable compound may be a compound having a site exhibiting other functions in the molecular structure depending on the purpose of the photopolymerizable composition and, for example, in the case of using the photopolymerizable composition for a recording material, the compound may have a site promoting color formation reaction of the color-forming component composing an image area and a site for suppressing the color formation. That will be described later.

The content of the polymerizable compound containing the above-mentioned ethylenic unsaturated bond is generally 10 to 99% by weight, preferably 30 to 95% by weight, of the entire weight of the photopolymerizable composition.

Compound Represented by the General Formula (I):

In the invention, a compound represented by the following general formula (I) is contained as a polymerization-auxiliary agent.

General formula (I)

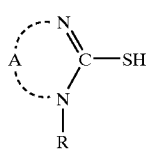

In the general formula (I), R represents one of an alkyl and aryl, either of which may have substituents; A represents an atom group forming one of a 5-member and a 6-member heteroring including an N=C—N portion and a carbon atom and A may further include a substituent group.

In the case R represents an alkyl in the above-mentioned general formula (I), the alkyl may be a straight chain or a branched chain and compose carbon atoms in number of preferably 3 to 20 and further preferably 5 to 16. The hydrophobicity is increased and humidity dependency is lessened by setting the number of carbon atoms to be 3 or higher. It is thought that this results from suppression of dissociation of the mercapto group, which depends on the humidity. Further, in the case of using an aqueous binder and in the case of laminating an aqueous protection layer, humidity dependency and raw storage property deterioration due to occurrence of diffusion and dissolution in the binder and the protection layer can be suppressed. Examples of this alkyl include propyl, butyl, pentyl, hexyl, heptyl, octyl, decyl, dodecyl, hexadecyl, and octadecyl and among them butyl, pentyl, hexyl, heptyl, and octyl are particularly preferable.

Further, in the case when the alky has a substituent group, examples of the substituent group include alkyl, alkenyl, an aryl, hydroxyl, nitro, cyano, halogen atoms, alkoxy, aryloxy, and acyl.

In the case when R represents an aryl in the above-mentioned general formula (I), the aryl comprises preferably 6 to 14 and more preferably 6 to 10 carbon atoms. Examples of this aryl include phenyl, α-naphthyl, β-naphthyl, anthryl, and phenanthryl.

In the case when the aryl has a substituent group, examples of the substituent group include alkyl, alkenyl, aryl, hydroxy, nitro, cyano, halogen atoms, alkoxy, aryloxy, and acyl.

The 5-member or 6-member heteroring represented by A in the above-mentioned general formula (I) may contain a nitrogen atom, a sulfur atom, or an oxygen atom. In the case when A has a substituent group, the substituent group may be an alkyl, an alkenyl, an aryl, a hydroxy, a nitro, a cyano, a carboxyl, a sulfo, a halogen atom, an alkoxy, an aryloxy, an alkoxycarbonyl, a carbamoyl, a sulfamoyl, an acyl, a sulfonyl, a sulfonylamino or the like.

Among the thiol compound represented by the above-mentioned general formula (I), a thiol compound represented by the following general formula (II) is preferable from a viewpoint of improving the hydrophobicity and desirably the humidity dependency and raw storage property.

General formula (II)

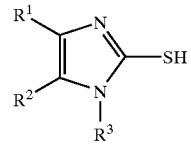

In the general formula, $R^1$ and $R^2$ independently represent hydrogen, an (un)substituted alkyl or an (un)substituted aryl and the alkyl and the aryl may be bonded to each other to form a ring. $R^1$ represents an (un)substituted alkyl or an (un)substituted aryl.

In the case when $R^1$ and $R^2$ independently represent an alkyl in the above-mentioned general formula (II), the alkyl may be a straight chain or a branched and compose carbon atoms in number of preferably 1 to 20 and further preferably 1 to 12. Examples of this alkyl includes methyl, ethyl, propyl, butyl, pentyl, hexyl, heptyl, octyl, decyl, dodecyl, hexadecyl and octadecyl.

Further, in the case when the alky has a substituent group, examples of the substituent group include an alkyl, an alkenyl, an aryl, a hydroxyl, a nitro, a cyano, a halogen atom, an alkoxy, an aryloxy and an acyl.

In the case when $R^1$ or $R^2$ represents an aryl in the above-mentioned general formula (II), the aryl preferably comprises 6 to 14 and more preferably 6 to 10 carbon atoms. Examples of this aryl includes phenyl, α-naphthyl and β-naphthyl.

In the case when the aryl has a substituent group, the substituent group may include an alkyl, an alkenyl, an aryl, a hydroxy, a nitro, a cyano, a halogen atom, an alkoxy, an aryloxy, an acyl or the like.

In the general formula (II), the alkyl and the aryl represented by $R^3$ may be defined same as the alkyl and the aryl represented by R in the above-mentioned general formula (I) and the preferable groups are also the same.

Hereinafter, specific examples (exemplified compounds (1) to (27)) defined by the above-mentioned general formulae (I) and (II) will be shown, however the invention is not limited to these examples.

(1)

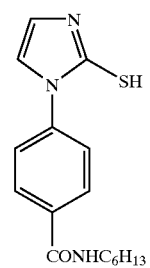

(2)

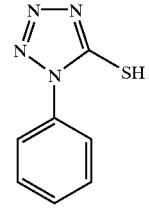

-continued
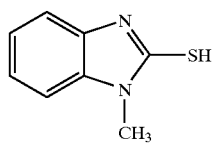
(3)
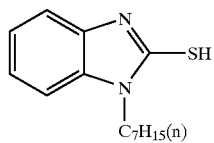
(4)
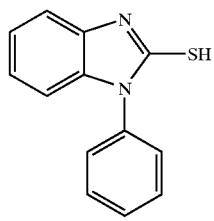
(5)
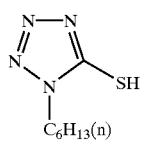
(6)
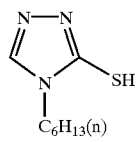
(7)
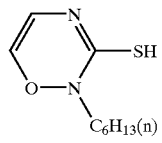
(8)
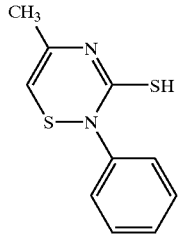
(9)
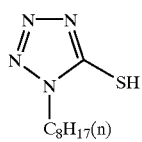
(10)
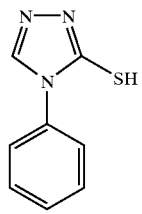
(11)
-continued
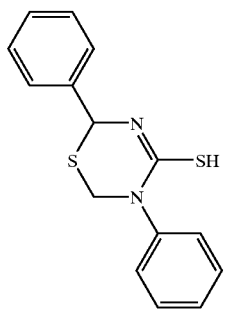
(12)
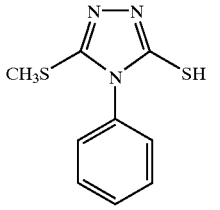
(13)
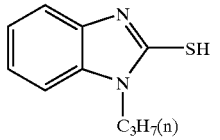
(14)
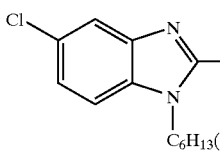
(15)
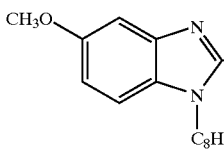
(16)
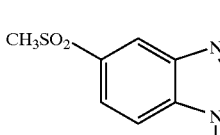
(17)
(18)
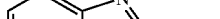
(19)

(20) 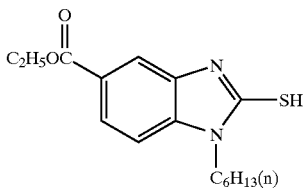

(21) 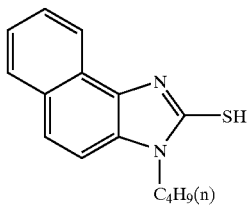

(22) 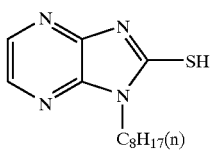

(23) 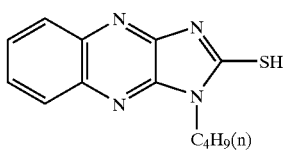

(24) 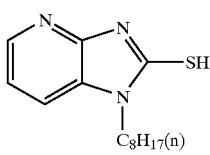

(25) 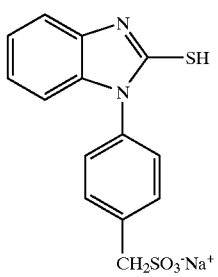

(26) 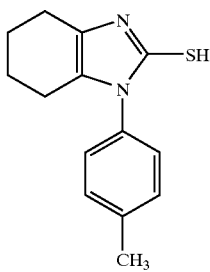

(27) 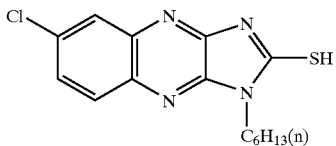

Photoradical Generating Agent:

In the photopolymerizable composition of the invention, the composition contains a photoradical generating agent capable of generating a radical by interacting with the above-mentioned spectral sensitizing dye. By having this photoradical generating agent coexist with the spectral sensitizing dye, the photopolymerizable composition sensitively responds to irradiated light of that spectral absorption wavelength region, and is able to generate the radical with high efficiency. Thus, high-sensitivity is obtained and generation of the radical can be controlled using a light source of a desired range, from visible light to infrared light.

One or more of photoradical generating agents may be selected from those capable of starting polymerization of the polymerizable compound contained in the above-mentioned photopolymerizable composition to be used as the above-mentioned photoradical generating agent.

Examples of the above-mentioned photoradical generating agent include benzophenone, campforquinone, 4,4-bis (dimethylamino)benzophenone, 4-methoxy-4'-dimethylaminobenzophenone, 4,4'-dimethoxybenzophenone, 4-dimethylaminobenzophenone, 4-dimethylaminoacetophenone, benzylanthraquinone, 2-tert-butylanthraquinone, 2-methylanthraquinone, xanthone, thioxanthone, 2-chlorothioxanthone, 2,4-diethylthioxanthone, fluorene, acridone, bisacylphosphine oxides such as bis(2,4,6-trimethylbenzoyl)-phenylphosphine oxide and the like, acylphosphine oxides such as Lucirin TPO and the like, α-hydroxy or α-aminoacetophenones, α-hydroxycycloalkyl-phenylketones, and aromatic ketones such as dialkoxyacetophenone; benzoin and benzoin ethers such as benzoinmethyl ether, benzoinethyl ether, benzoinpropyl ether, benzoinphenyl ether, and the like; 2,4,6-triarylimidazole dimers such as 2-(o-chlorophenyl)-4,5-diphenylimidazole dimer, 2-(o-chlorophenyl)-4,5-di(m-methoxyphenyl)imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer; and lophine dimer compounds described in U.S. Pat. Nos. 3,784,557, 4,252,887, 4,311,783, 4,459,349, 4,410,621, 4,622,286 and the like: polyhalogen compounds such as tetrabromocarbon, phenyltribromomethylsulfone, phenyltrichloromethyl ketone and the like; and compounds described in JP-A No. 59-133428, Japanese Patent Application Publication (JP-B) Nos. 57-1819, 57-6096, U.S. Pat. No. 3,615,455; S-triazine derivatives (trihalomethyl compounds) having trihalogen-substituted methyl described in JP-A No. 58-29803 such as 2,4,6-tris(trichloromethyl)-S-triazine, 2-methoxy-4,6-bis (trichloromethyl)-S-triazine, 2-amino-4,6-bis (trichloromethyl)-S-triazine, 2-(P-methoxystyryl-4,6-bis (trichloromethyl)-S-triazine and the like; organic peroxides described in JP-A No. 59-189340 such as methyl ethyl ketone peroxide, cyclohexanone peroxide, 3,3,5-trimethylcyclohexanone peroxide, benzoyl peroxide, di-tert-butyl peroxyisophthalate, 2,5-dimethyl-2,5-di (benzoylperoxy)hexane, tert-butyl peroxybenzoate, a,a'-bis (tert-butylperoxyisopropyl)benzene, dicumyl peroxide, 3,3', 4,4'-tetra-(tert-butylperoxycarbonyl)benzophenone and the like; azinium compounds; organic boron compounds; phenylglyoxalic acid esters such as phenylglyoxalic methyl ester; titanocenes such as bis($\eta^5$-2,4-cyclopentadien-1-yl)-bis(2,6-difluoro-3-(1H-pyrrol-1-yl)-phenyl)titanium and the like; iron allene complexes such as $\eta^5$-cyclopentadienyl-$\eta^6$-cumenyl-iron (1+)-hexafluorophosphate (1−) and the like; diaryl iodonium salts such as diphenyl iodonium and the like; and triaryl sulfonium salts such as triphenyl sulfonium salt and the like as described in U.S. Pat. No. 4,743,530;

More detailed examples of the above-mentioned radical generating agent and examples of other kinds of radical generating agents are described in paragraphs [0067] to [0132] of JP-A No. 10-45816.

Moreover, as the above-mentioned radical generating agent, two or more kinds of those exemplified compounds may be used in combination. Examples thereof include the following: combinations of 2,4,5-triarylimidazole dimer and mercaptobenzoxazole, combinations of 4,4'-bis (dimethylamino)benzophenone, benzophenone, and benzoin methyl ether described in U.S. Pat. No. 3,427,161, combination of benzoyl-N-methylnaphtothiazoline and 2,4-bis (trichloromethyl)-6-(4'-methoxyphenyl)-triazole described in U.S. Pat. No. 4,239,850, combinations of dialkylaminobenzoic acid ester and dimethyltihoxanthone described in JP-A No. 57-23602, and combination of three kinds of compounds (4,4'-bis(dimethylamino)benzophenone, benzophenone, and polyhalogenated methyl compound) described in JP-A No. 59-78339.

In the case of the radical generating agent comprising two or more kinds of compounds in combination, the combination of 4,4'-bis(diethylamino)benzophenone with benzophenone and the combination of 2,4-diethylthioxanthone with 4-dimethylaminobenzoic acid ester, and the combination of 4,4'-bis(diethylamino)benzophenone with 2,4,5-triarylimidazole dimer are preferably employed.

Among the above-mentioned radical generating agents, organic boron compounds, diaryl iodonium salts, iron allene complexes, S-triazine derivatives having trihalogen-substituted methyl, organic peroxides, titanocenes, 2,4,5-triarylimidazole dimer, and azinium compounds are preferable and organic boron compounds are especially preferable since they can generate radical effectively by interacting with a dye in an exposure wavelength region and provide high sensitivity. The organic boron compounds are preferable in terms of the capability of efficiently decolor formation a spectral sensitizing dye coexisting at the time of image fixation by light radiation even in the case when the spectral sensitizing dye is used as the spectral sensitizing compound. Further, the organic boron compounds may be used in combination with the above-mentioned radical generating agents.

The organic boron compounds include the compounds represented by the general formula (A) which will be described later and spectral sensitizing dye-type organic boron compounds having, as cationic portions, cationic dyes described in "Chemistry of Functional Dye", CMC Publishing Co., Ltd., 1981, pp. 393–416, "Color formation Materials", 60 [4], 1987, 212–224. Examples of the spectral sensitizing dye-type organic boron compounds include compounds described in JP-A Nos. 62-143044, 1-138204, Japanese Patent Application National Publication No. 6-505287 and JP-A No. 4-261406.

As the dyes composing the cationic portions of the above-mentioned spectral sensitizing dye-type organic boron compounds, cationic dyes having a maximum absorption wavelength in a wavelength region of at least 300 nm, preferably in a wavelength region of 400 to 1,100 nm, may be used. Among them, cationic methine dyes, polyemthine dyes, triarylmethane dyes, indoline dyes, azine dyes, xanthene dyes, cyanine dyes, hemicyanine dyes, Rhodamine dyes, azomethine dyes, oxazine dyes, and acridine dyes are preferable and cationic cyanine dyes, hemicyanine dyes, Rhodamine dyes, and azomethine dyes are more preferable.

Among the above-mentioned organic boron compounds, the compounds represented by the following general formula (A) are preferable.

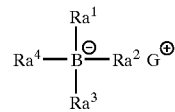

General formula (A)

In the general formula (A), each of $R_a^1$, $R_a^2$, $R_a^3$, and $R_a^4$ independently represents an aliphathic group, an aromatic group, a heterocyclic group or $Si(R_a^5)(R_a^6)$—$R_a^7$.

When at least one of $R_a^1$ to $R_a^4$ represents an aliphatic group, examples of the aliphatic group include an alkyl, a substituted alkyl, an alkenyl, a substituted alkenyl, an alkinyl, a substituted alkinyl, an aralkyl and a substituted aralkyl. Among these examples, an alkyl, a substituted alkyl, an alkenyl, a substituted alkenyl, an aralkyl, and a substituted aralkyl are preferable and an alkyl and a substituted alkyl are especially preferable.

Moreover, the above-mentioned aliphatic group may be an alicyclic group and a chain aliphatic group. The chain aliphatic group may have branches.

The above-mentioned alkyl include a straight chain, a branched, and a cyclic alkyl and the number of the carbon atoms of the alkyl is preferably 1 to 30, and more preferably 1 to 20. Further, the alkyl may include a substituted alkyl having a substituent group and an unsubstituted alkyl. The alkyl portion of the substituted alkyl may contain carbon atoms in the same number range as that of the alkyl.

Examples of the above-mentioned alkyl includes methyl, ethyl, propyl, butyl, pentyl, hexyl, cyclopentyl, neopentyl, isopropyl, isobutyl, cyclohexyl, octyl, 2-ethylhexyl, decyl, dodecyl and octadecyl.

Examples of the substituent groups of the above-mentioned substituted alkyl include a carboxyl, a sulfo group, a cyano group, a halogen atom (e.g. fluorine atom, chlorine atom, bromine atom), a hydroxyl, an akloxycarbonyl of 30 or less carbon atoms (e.g. a methoxycarbonyl, an ethoxycarbonyl, a benzyloxycarbonyl), an alkylsulfonylaminocarbonyl having 30 or fewer carbon atoms, an arylsulfonylaminocarbonyl, an alkylsulfonyl, an arylsulfonyl, an acylaminosulfonyl having 30 or fewer carbon atoms, an alkoxy having 30 or fewer carbon atoms (e.g. methoxy, ethoxy, benzyloxy, phenethyloxyl and the like), an alkylthio group having 30 or fewer carbon atoms (e.g. methylthio, ethylthio, methylthioethylthioethyl and the like), an aryloxy having 30 or fewer carbon atoms (e.g. phenoxy, p-tolyloxy, 1-naphthoxy, 2-naphthoxy, and the like), a nitro group, an alkyl having 30 or fewer carbons, an alkoxycarbonyloxy group, an aryloxycarbonyloxy group, an acyloxy having 30 or fewer carbon atoms (e.g. acetyloxy, propionyloxy and the like), an acyl having 30 or fewer carbon atoms (e.g. acetyl, propionyl, benzoyl and the like), a carbamoyl (e.g. carbamoyl, N,N-dimethylcarbamoyl, morpholinocarbonyl, piperidinocarbonyl, and the like), a sulfamoyl (e.g. sulfamoyl, N,N-dimethylsulfamoyl, morpholinosulfonyl, piperidinosulfonyl and the like), an aryl having 30 or fewer carbon atoms (e.g. phenyl, 4-chlorophenyl, 4-methylphenyl, α-naphthyl and the like), a substituted amino group (e.g. amino, alkylamino, dialkylamino, arylamino, diarylamino, acylamino, and the like), a substituted ureido group, a substituted phosphono group, and a heteroring group. In this case, the carboxyl, the sulfo, the hydroxy, the phosphono may be in the form of salts. In this case, the cations forming the salts include $G^+$ which will be described later.

Examples of the above-mentioned alkenyl include straight chain, branched, and cyclic alkenyls and the number of carbon atoms of the alkenyl is preferably 2 to 30 and more preferably 2 to 20. The alkenyl may be a substituted alkenyl having a substituent group and an unsubstituted alkenyl and the number of carbon atoms of the alkenyl portion of the substituted alkenyl is in the same range as that of the alkenyl.

The substituent group of the above-mentioned alkenyl includes the same substituent groups as those exemplified in the case of the above-mentioned substituted alkyl.

Examples of the above-mentioned alkinyl include straight chain, branched, and cyclic alkinyls and the number of carbon atoms of the alkinyl is preferably 2 to 30 and more preferably 2 to 20. The alkinyl may be a substituted alkinyl and an unsubstituted alkinyl and the number of carbon atoms of the alkinyl portion of the substituted alkinyl is in the same range as that of the alkinyl.

The substituent group of the above-mentioned alkinyl includes the same substituent groups as those exemplified in the case of the above-mentioned substituted alkyl.

Examples of the above-mentioned aralkyl include straight chain, branched, and cyclic aralkyls and the number of carbon atoms of the aralkyl is preferably 7 to 35 and more preferably 7 to 25. The aralkyl may be a substituted aralkyl and an unsubstituted aralkyl and the number of carbon atoms of the aralkyl portion of the substituted aralkyl is in the same range as that of the aralkyl.

The substituent group of the above-mentioned aralkyl includes the same substituent groups as those exemplified in the case of the above-mentioned substituted alkyl.

When at least one of $R_a^1$ to $R_a^4$ represents an aromatic alkyl, the aromatic group includes, for example, an aryl and a substituted aryl. The number of carbon atoms of the aryl is preferably 6 to 30 and more preferably 6 to 20. The preferable number of carbon atoms of the aryl portion of the substituted aryl is in the same range of that of the aryl. Examples of the aryl include phenyls, α-naphthyls and β-naphthyls.

The substituent group of the substituted aryl includes the same substituent groups as those exemplified in the case of the above-mentioned substituted alkyl.

In the case the above-mentioned $R_a^1$ to $R_a^4$ independently represent a heteroring group, the heteroring group includes, for example, a substituted heteroring group and an unsubstituted heteroring group. The substituent group of the substituted heteroring group includes the same substituent groups as those exemplified in the case of the above-mentioned substituted alkyl.

Among these, the heteroring group represented by $R_a^1$ to $R_a^4$ is preferably a heteroring group containing a nitrogen atom, a sulfur atom, or an oxygen atom such as a furan ring, a pyrrole ring, an imidazole ring, an oxazole ring, a thiazole ring, a pyridine ring and the like.

In the case $R_a^1$ to $R_a^4$ independently represent $Si(R_a^5)(R_a^6)-R_a^7$, and $R_a^5$, $R_a^6$, and $R_a^7$ independently represent an aliphatic group or an aromatic group. The aliphatic group and the aromatic group are same as the above-mentioned aliphatic group and aromatic group represented by $R_a^1$ to $R_a^4$, respectively and their preferably examples are also same as exemplified.

In the above-mentioned general formula (A), two or more of $R_a^1$, $R_a^2$, $R_a^3$ and $R_a^4$ may be bonded directly or through a substituent group to form a ring. In the case a ring is formed, the ring is preferably any ring selected from the following rings (C1) to (C3) and the ring (C2) is preferable.

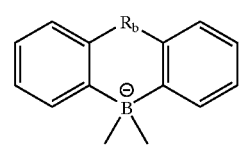
(C1)

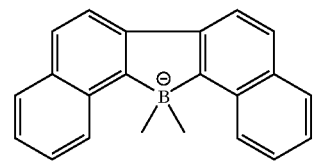
(C2)

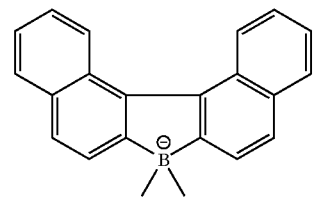
(C3)

In the forgoing ring (C1), $R_b$ represents the following divalent groups:

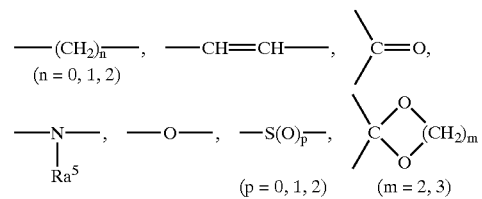

$R_a^5$ represents H or a monovalent substituent group.

Among organic boron compounds represented by the above-mentioned general formula (A), at least one of $R_a^1$ to $R_a^4$ is preferably an alkyl, and from a viewpoint of improving the sensitivity and the storage property, triaryl alkyl organic boron compounds where one of $R_a^1$ to $R_a^4$ is an alkyl and the remaining three are aryl groups are more preferable.

Especially, triaryl alkyl organic boron compounds of which the aryl groups are substituted with electron attracting groups are preferable and above all, those having a total of the Hammet (σ) values of the substituent groups (the electron attracting groups) of the three aryl groups in a range from +0.36 to +2.58 are more preferable.

The above-mentioned electron attracting groups are preferably halogen atoms, trifluoromethyl and especially preferably fluorine atom, chlorine atom.

Examples of the aryl groups substituted with the electron attracting groups include 3-fluorophenyl, 4-fluorophenyl, 2-fluorophenyl, 3-chlorophenyl, 4-chlorophenyl, 3-trifluoromethylphenyl, 4-trifluoromethylphenyl, 3,5-difluorophenyl, 4-bromophenyl, 3,4-difluorophenyl, 5-fluoro-2-methylphenyl, 5-fluoro-4-methylphenyl, 5-chloro-2-methylphenyl and 5-chloro-4-methylphenyl.

Examples of the anion portion of the above-mentioned general formula (A) includes tetramethyl borate, tetraethyl borate, tetrabutyl borate, triisobutyl borate, di-n-butyl-di-tert-butyl borate, tri-m-chlorophenyl-n-hexyl borate, triphenylmethyl borate, triphenylethyl borate, triphenylpropyl borate, triphenyl-n-butyl borate, trimesicylbutyl borate, tritolylisopropyl borate, triphenylbenzyl borate, tetra-m-fluorobenzyl borate, triphenylphenetyl borate, triphenyl-p- chlorobenzyl borate, triphenylethenylbutyl borate, di(α-naphthyl)-dipropyl borate, triphenylsilyltriphenyl borate, tritolylsilyltriphenyl borate, tri-n-butyl(dimethylphenylsilyl) borate, diphenyldihexyl borate, tri-m-fluorophenylhexyl borate, tri(5-chloro-4-methylphenyl)hexyl borate, tri-m-fluorophenylcyclohexyl borate and tri-(5-fluoro-2-methylphenyl)hexyl borate.

In the above-mentioned general formula (A), $G^+$ represents a group capable of forming a cation. Above all, organic cationic compounds, transition metal coordination complex cations (compounds described in Japanese Patent No. 2,791,143) and metal cations (e.g. $Na^+$, $K^+$, $Li^+$, $Ag^+$, $Fe^{2+}$, $Fe^{3+}$, $Cu^+$, $Cu^{2+}$, $Zn^{2+}$, $Al^{3+}$, $½Ca^{2+}$, and the like) are preferable.

Examples of the above-mentioned organic cationic compounds include quaternary ammonium cations, quaternary pyridinium cations, quaternary quinolinium cations, phosphonium cations, iodonium cations, sulfonium cations and dye cations.

Examples of the above-mentioned quaternary ammonium cations include tetraalkylammonium cations (e.g. tetramethylammonium cation, tetrabutylammonium cation), and tetraarylammonium cations (e.g. tetraphenylammonium cation). Examples of the above-mentioned quaternary pyridinium cations include N-alkylpyridinium cations (e.g. N-methylpyridinium cation), N-arylpyridinium cation (e.g. N-phenylpyridinium cation), N-alkoxypyridinium cation (e.g. 4-phenyl-N-methoxy-pyridinium cation) and N-benzoylpyridinium cation. Examples of the above-mentioned quinolinium cations include N-alkylquinolinium cation (e.g. N-methylquinolinium cation) and N-arylquinolinium cation (e.g. N-phenylquinolinium cation). Examples of the above-mentioned phosphonium cations include tetraarylphosphonium cation (e.g. tetraphenylphosphonium cation). Examples of the above-mentioned iodonium cations include diaryliodonium cation (e.g. diphenyliodonium cation). Examples of the sulfonium cations include triarylsulfonium cation (e.g. triphenylsulfonium cation).

Further, specific examples of the above-mentioned $G^+$ also include compounds described in paragraphs [0020] to [0038] of JP-A No. 9-188686.

In the above exemplified respective cationic compounds (the exemplified compounds), the alkyl preferably contains 1 to 30 carbons and examples thereof include unsubstituted alky such as methyl, ethyl, propyl, isopropyl, butyl, hexyl and the like and the above-mentioned substituted alkyl represented by $R_a^1$ to $R_a^4$ are preferable. Among them, an alkyl containing carbons in number of 1 to 12 are especially preferable.

Further, in the above exemplified respective cationic compounds, preferable examples of the aryl include phenyl, halogen (e.g. chlorine)-substituted phenyl, an alkyl (e.g. methyl)-substituted phenyl, an alkoxy (e.g. methoxy)-substituted phenyl.

Specific examples of the organic boron compounds represented by the above-mentioned general formula (A) include compounds described in U.S. Pat. Nos. 3,567,453, 4,343,891, JP-A Nos. 62-143044, 62-150242, 9-188684, 9-188685, 9-188686, 9-188710, JP-B No. 8-9643, JP-A No. 11-269210 and the compounds given below. The organic boron compounds may be used in combination with a radical generating agent which will be described later. However, the above-mentioned organic boron compounds to be employed in the invention are not limited to those exemplified.

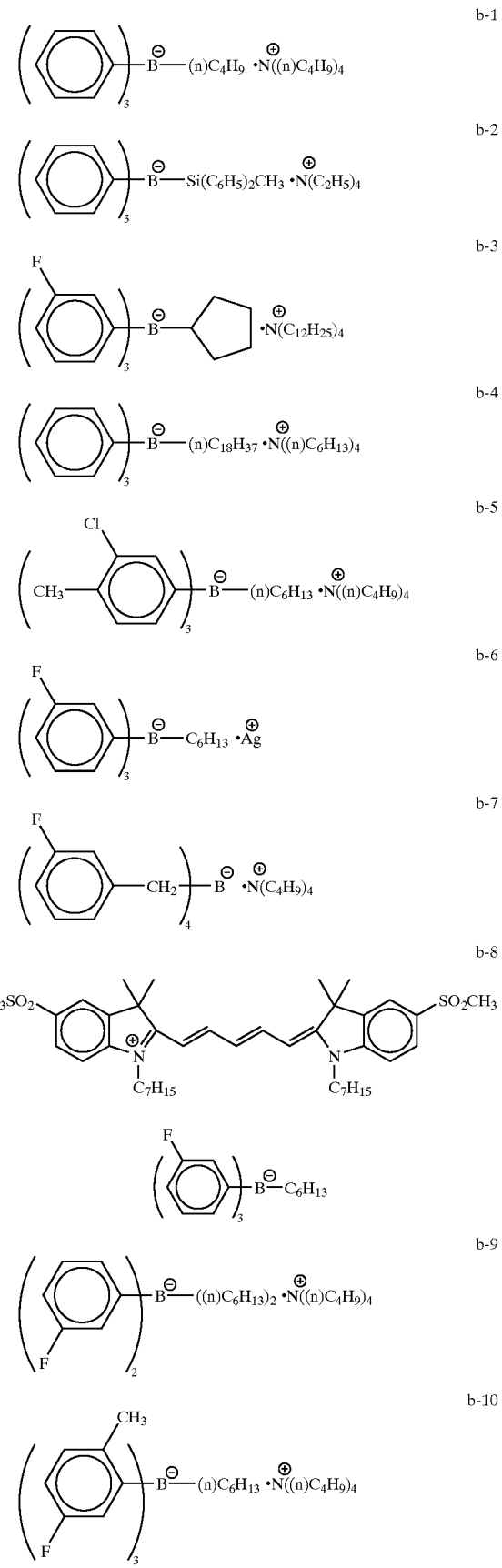

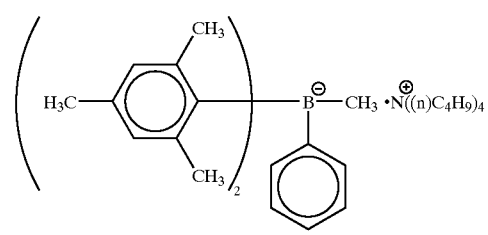 b-11
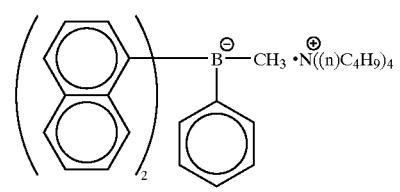 b-12
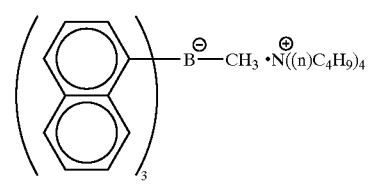 b-13
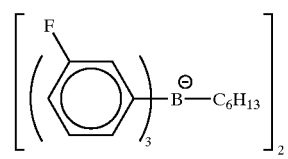 b-14
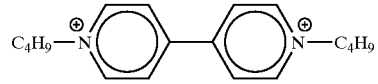
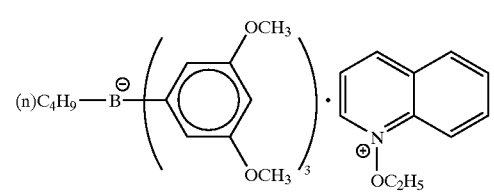 b-15
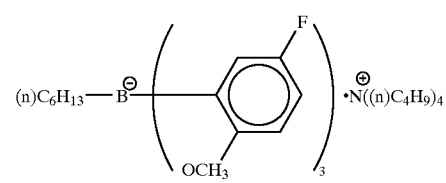 b-16
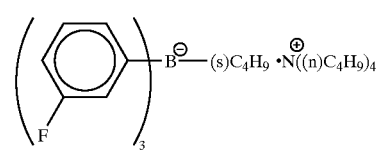 b-17
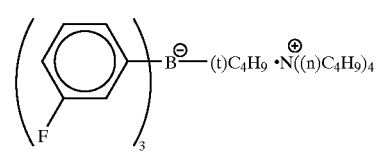 b-18
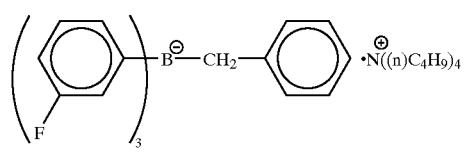 b-19
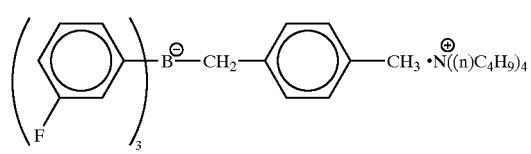 b-20
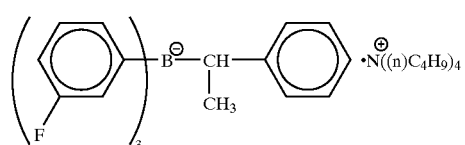 b-21
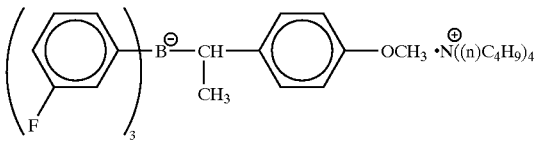 b-22
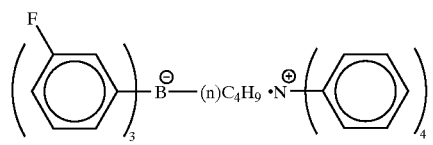 b-23
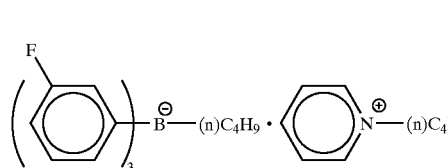 b-24
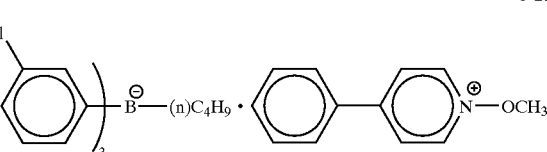 b-25
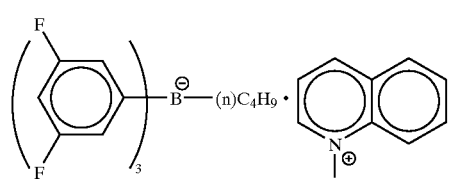 b-26
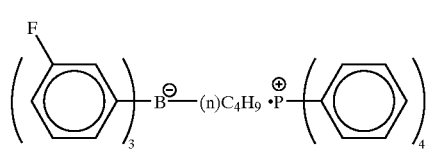 b-27

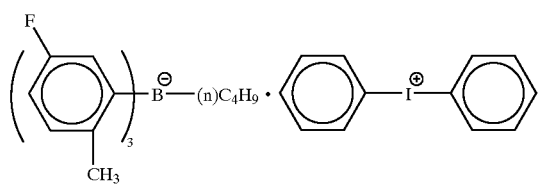
b-28

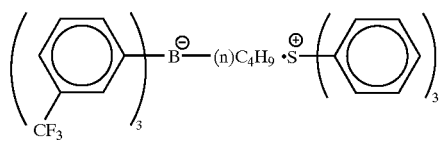
b-29

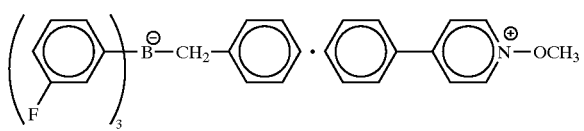
b-30

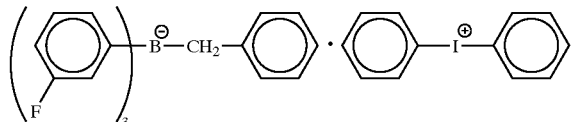
b-31

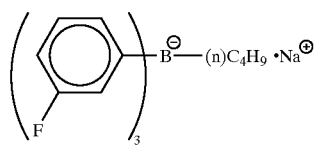
b-32

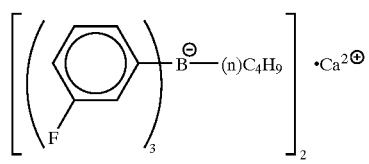
b-33

In the photopolymerizable composition, the content of the radical generating agent is preferably 0.01 to 20% by weight and more preferably 0.1 to 10% by weight in relation to the content of the above-mentioned polymerizable compound having ethylenic unsaturated bond. However, the preferable range changes depending on the types of "polymerizable compounds having ethylenic unsaturated bond" to be used in combination, so that it is not limited as described.

Other Components:

In the photopolymerizable composition of the invention, well-known additives properly selected depending on the purpose of the invention may be added to the extent that they do not inhibit the effects of the invention.

Examples of the above-mentioned other components include photopolymerization initiators, oxygen removing agents, thermal polymerization inhibitors, UV absorbers, brightening agents, chain transporting agents, anti-oxidants and their precursors. They may be added preferably in an amount that is 0.01 to 20% by weight, more preferably in 0.2 to 15% by weight, and even more preferably 0.5 to 10% by weight, based on the total weight of the photopolymerizable composition.

Specific examples of the additives such as the above-mentioned chain transporting agent and antioxidant include compounds described in paragraphs [0135] to [0141] of JP-A No. 10-45816, paragraphs [0087] to [0096] of JP-A No. 9-188686, paragraphs [0079] to [0118] of JP-A No. 10-182621, paragraphs [0080] to [0089] of JP-A No. 9-95487 and further compounds described in JP-A Nos. 1-13140, 1-13141, 1-13143, 1-13144, 1-17048, 1-229003, 1-298348, 10-138638, 11-269210, 2-187762 and the like.

The photopolymerizable composition of the invention may also contain a binder. Especially, the binder addition is suitable in the case the photopolymerizable composition is a liquid or a viscous substance.

The content of the binder is preferably 5 to 95% by weight, further preferably 10 to 90% by weight, and furthermore preferably 15 to 85% by weight in relation to the total solid matter content.

The binder is selected depending on application fields and the properties required for the application fields, for example, the development capability in aqueous or organic solvent system, adhesion to a substrate, and the sensitivity to oxygen.

The above-mentioned binder is preferably a compolymer having a molecular weight of about 5,000 to 2,000,000, and preferably 10,000 to 1,000,000. Examples include homo or copolymers of acrylate and methacrylate [e.g. methyl methacrylate, ethyl acrylate/methacrylic acid copolymer, poly(alkyl methacrylate), poly(alkyl acrylate) and the like], cellulose esters or cellulose ethers (e.g. cellulose acetate, cellulose acetobutyrate, methyl cellulose, ethyl cellulose, and the like), polyvinyl butyral, polyvinyl formal, cyclized rubber, polyethers (e.g. polyethylene oxide, polypropylene oxide, polytetrahydrofuran), polystyrene, polycarbonates, polyurethanes, chlorinated polyolefins, polyvinyl chloride, vinyl chloride/vinylidene copolymers, copolymers of vinylidene chloride and acrylonitrile, methyl methacrylate, vinyl acetate, polyvinyl acetate, ethylene-vinyl acetate copolymers, polylcaprolactone, poly (hexamethyleneadipamide), polyesters [e.g. poly(ethylene glycol terephthalate), poly(hexamethylene glycol succinate), and the like], polyamides, and polyureas.

Further, examples of the binder include water-soluble polymers such as gelatins, (modified) polyvinyl alcohol, polyvinyl pyrrolidone, styrene-maleic acid copolymer hydrolysis products, poly(sodium styrenesulfonate), sodium alginate. Further, latexes such as styrene-butadiene rubber latex, acrylonitrile-butadiene rubber latex, methyl acrylate-butadiene rubber latex and the like may be employed.

An unsaturated compound may be used as a mixture with a non-polymerizable film forming component and may include, for example, a physically dried polymer or a polymer solution containing a polymer in an organic solvent. Specific examples of the unsaturated compound include nitrocellulose and cellulose acetate. However, the examples may be chemically and/or thermally curable (thermosetting) resin, for example, polyisocyanates, polyepoxides, melamine resin, and polyimide precursors. Simultaneous use of such thermosetting resin is important for use in called hybrid system in which photopolymerization is carried out in a first step and then cross-linking is carried out by post-heat treatment in a second step.

Further, a binder having a polymerizable group is also usable.

Besides, examples of the additives include those described in JP-A No. 11-269210.

A light source usable at the time of carrying out image-wise exposure may be appropriately selected from among well-known light sources having light source wavelength in a region recovering the visible light rays to IR ray wavelength and above all, a light source having the maximum absorption wavelength of 300 to 1,000 nm is preferable and in terms of easy miniaturization of the apparatus and keeping cost down, a blue-, green-, or red-emitting (semiconductor) laser light source or LED is more preferable. Incidentally, in order to obtain higher sensitivity, it is preferable to properly select a light source with wavelength similar to the absorption wavelength of the light absorber such as a spectral sensitizing dye and the like.

On the other hand, as a light source usable at the time of decoloration of the above-mentioned photopolymerizable composition and a recording material to be referred to later, it is more preferable to properly select a light source having the wavelength similar to the wavelength of the photopolymerizable composition. Specifically, examples of usable lamps include a wide range of light sources such as a mercury lamp, an ultra high pressure mercury lamp, an electrodeless discharge type mercury lamp, a xenon lamp, a tungsten lamp, a metal halide lamp, a (semiconductor) laser light source, an LED and a fluorescent lamp.

In the case when the photopolymerizable composition of the invention is used for a recording material by adding a thiol compound represented by the general formula (I) as a polymerization auxiliary agent, since no reaction with a vinyl sulfone-based film-curing agent is caused unlike a conventional case, the storage property can be improved. Further, even in the case a compound with a high solubility in water is used in combination, undesirable effects by humidity can be prevented by the oil-soluble group-containing thiol compound represented by the general formula (I).

Recording Material:

The recording material of the invention comprises a recording layer on a substrate and the recording layer contains at least a color-forming component A, a color-forming component B having a site for color formation by reaction with the color-forming component A and the above-mentioned photopolymerizable composition and if necessary it may further comprise other layers such as an underlayers, intermediate layers, light absorption layers, protection layers, back coating layers and the like.

The basic embodiment of the recording material of the invention is not particularly limited and properly composed depending on the purposes.

As the basic embodiment, for example, image formation in the case when the recording material of the invention is applied to a positive type photosensitive and heat-sensitive recording material in which the color-forming component A is enencapsulated in a heat-responding microcapsule will be exemplified.

That is, in the positive type photosensitive and heat-sensitive recording material of this embodiment, when light is imagewise radiated, a radical is generated from the radical generating agent contained in the photopolymerizable composition in the light-radiated area and at the same time, polymerization reaction of the above-mentioned polymerizable compound is initiated to cure and fix the photopolymerizable composition in situ to form a latent image. The above-mentioned microcapsule is substance-impermeable at a normal temperature and the color-forming component A enencapsulated in the microcapsule and the color-forming component B having a site for color formation by reaction with the color-forming component A are kept in no-coloration state and not brought into contact with each other.

Afterwards, when heat is applied to the whole surface of the photosensitive and heat-sensitive recording material, the microcapsule is transformed to be substance-permeable and the color-forming component B in the light-unradiated area penetrates the microcapsule (and/or the color-forming component A is released to the outside of the microcapsule) and the color-forming components A and B are reacted with each other to color only in the light-unradiated area. While, in the light-radiated area, since the photopolymerizable composition is cured and fixed by polymerization reaction, the color-forming components A and B are both passivated and thus cannot be brought into contact with each other and therefore, no coloration takes place in the light-radiated area. After that, polymerization (fixation) is carried out even in the area where no polymerization takes place by carrying out entire surface exposure of the above-mentioned photosensitive and heat-sensitive recording material and the dye component contained in the photopolymerizable composition can be decolored.

Further, the recording material of the invention may be recording materials with the following embodiments (a first and a second embodiments) and image formation methods can be properly selected as well depending on the respective embodiments.

That is, in the recording material of the first embodiment, at least one of polymerizable compounds contained in the photopolymerizable composition is the above-mentioned color-forming component B and the recording layer contains the photopolymerizable composition of the invention containing at least the color-forming component A and the color-forming component B for color formation the color-forming component A. In this case, if the positive type photosensitive and heat-sensitive recording material with the above-mentioned basic embodiment is exemplified, the color-forming component B has a portion for color formation the color-forming component A as described above and also an ethylenic unsaturated bond and when light is radiated imagewise, the color-forming component B starts polymerization reacting and is cured and the color-forming component B is fixed in situ to form a latent image. Accordingly, in the light-radiated area, the color-forming component B is immobilized and cannot be brought into contact with the color-forming component A and therefore, no coloration takes place in the light-radiated area.

The recording material of the second embodiment of the invention has a recording layer containing at least the color-forming component A, the color-forming component B for color formation by reaction with the color-forming component A, and the above-mentioned photopolymerizable composition of the invention and the polymerizable compound having the ethylenic unsaturated bond and contained in the photopolymerizable composition is a color formation suppressing compound having a site (reaction suppressing site) for suppressing the reaction of the above-mentioned color-forming component A and color-forming component B in a single molecule.

The recording material of the second embodiment will be described by exemplifying image formation when the recording material is used for a negative type photosensitive and heat-sensitive recording material in which the color-forming component A is enencapsulated in heat responding microcapsule.

In the negative type photosensitive and heat-sensitive recording material of this embodiment, similar to the above-mentioned first embodiment, the microcapsule is substance-impermeable at a normal temperature and the color-forming components A and B are not brought into contact with each other and in non-color formation state. When light is imagewise radiated to the photosensitive and heat-sensitive recording material, the polymerizable compound in the light-radiated area starts polymerization reaction and is cured and fixed in situ to form a latent image. Afterwards, when heat is applied to the whole surface of the photosensitive and heat-sensitive recording material, the microcapsule is transformed to be substance-permeable and the color-forming component B penetrates the microcapsule (and/or the color-forming component A is released to the outside of the microcapsule). Simultaneously in the light-unradiated area, the polymerizable compound also penetrates, as a color formation suppressing compound, the microcapsule to suppress the color formation reaction of the color-forming components A and B and accordingly, the light-unradiated area is kept in non-color formation state. On the other hand, the polymerizable compound (the color formation suppressing compound) in the light-radiated area is fixed in situ by the polymerization reaction, so that it does not affect the reaction between the color-forming components A and B and color formation reaction is promoted to color only the light-radiated area. After that, decoloration of the dye contained in the photopolymerizable composition can be performed by carrying out entire surface exposure of the above-mentioned photosensitive and heat-sensitive recording material.

As the light source to be employed for the image formation using the recording material of the invention, similar light sources to those usable for the exposure of the above-mentioned photopolymerizable composition of the invention may be employed.

Hereinafter, the constituent components to be employed for the recording material of the invention will be described.

Photopolymerizable Composition:

The above-mentioned photopolymerizable composition contains 1) a polymerizable compound having an ethylenic unsaturated bond (a polymerizable compound), 2) a decolorable cyanine-type organic dye (spectral sensitizing dye), 3) a radical generating agent capable of generating a radical by interacting with the dye and, if necessary, may further contain 4) other components and in the recording material of the invention, the above-mentioned photopolymerizable composition of the invention is used.

When light is radiated on the above-mentioned photopolymerizable composition, the above-mentioned spectral sensitizing dye absorbs the light and interacts with the above-mentioned radical generating agent and thus the radical generating agent generates radical. Owing to the radical, the above-mentioned polymerizable compound is cured by radical polymerization to form an image.

Details of the above-mentioned polymerizable compound are as described above and a plurality of types of these compounds may be added to the photopolymerizable composition. Similar to the recording material of the above-mentioned first embodiment, at least one of them may be the color-forming component B having a site for color formation the color-forming component A, and a dye component having an ethylenic unsaturated bond (a polymerizable group) in a single molecule as described later is employed.

Meanwhile, similar to the recording material of the above-mentioned second embodiment, the polymerizable compound may also function as a color formation suppressing compound and a polymerizable compound having a site for suppressing the reaction of the color-forming component A, and the color-forming component B for color formation the color-forming component A is employed.

These polymerizable compounds will be described later together with the color-forming components (A and B) contained in the recording layer.

The amount of the above-mentioned photopolymerizable composition in the recording layer is preferably 0.1 to 50 g/m$^2$ and more preferably 1 to 30 g/m$^2$.

Color-forming Components:

In the recording material of the invention, the recording layer contains the above-mentioned color-forming component A and color-forming component B as the color sources and the photopolymerizable composition as well. In the case of the recording material of the above-mentioned first embodiment, the recording layer contains the color-forming component A together with the photopolymerizable composition and the color-forming component B contained as the polymerizable compound in the photopolymerizable composition side reacts on the color-forming component A to carry out coloration.

The combinations of the color-forming component A and the color-forming component B as the color formation sources composing the image area include the following combinations (A) to (S). In the following combinations, the color-forming component A and the color-forming component B are shown in the following order.

(A) A combination of an electron-donating dye precursor and an electron-accepting compound.

(B) A combination of a diazo compound and a coupling component (hereinafter, sometimes referred to as a coupler compound).

(C) A combination of an organic acid metal salt such as silver behenate, silver stearate and the like and a reducing agent such as protocatechin acid, spiroindane, hydroquinone and the like.

(D) A combination of a long chain fatty acid iron salt such as ferric stearate, ferric myristate, and the like and a phenol such as tannic acid, gallic acid, ammonium salicylate and the like.

(E) A combination of an organic acid heavy metal salt such as nickel, cobalt, lead, copper, iron, mercury, and silver salts of acetic acid, stearic acid, palmitic acid and the like and an alkali or alkaline earth metal sulfide such as calcium sulfide, strontium sulfide, potassium sulfide or the above-mentioned organic acid heavy metal salt and an organic chelating agent such as S-diphenylcarbazide, diphenylcarbazone and the like.

(F) A combination of a heavy metal sulfate such as silver, lead, mercury, and sodium sulfuric acid salts and a sulfur compound such as sodium tetrathionate, sodium thiosulfate, thourea and the like.

(G) A combination of a ferric fatty acid salt such as ferric stearate and an aromatic polyhydroxy compound such as 3,4-hydroxytetraphenylmethane and the like.

(H) A combination of an organic acid metal salt such as silver oxalate, mercury oxalate and the like and an organic polyhydroxy compound such as polyhydric alcohol, glycerin, glycol and the like.

(I) A combination of a fatty acid ferric salt such as ferric pelargonate, ferric laurate and the like and a thiocecylcarbamide or isothiocecylcarbamide derivative.

(J) A combination of an organic acid lead salt such as lead caproate, lead pelargonate, lead behenate and the like and a thiourea derivative such as ethylenethiourea, N-dodecylthiourea.

(K) A combination of a higher fatty acid heavy metal salt such as ferric stearate, copper stearate and zinc dialkyldithocarbamate.

(L) A combination of substances forming an oxazine dye such as a combination of resorcin and a nitroso compound.

(M) A combination of a formazan compound and a reducing agent and/or a metal salt.

(N) A combination of a protected dye (or leuco dye) precursor and a de-protection agent.

(O) A combination of an oxidation type color formation agent and an oxidizing agent.

(P) A combination of a phthalonitrile and diiminoisoindoline (a combination for producing a phthalocyanine).

(Q) A combination of a isocyanate and diiminoisoindoline (a combination for producing a color formation pigment).

(R) A combination of a pigment precursor with an acid or a base (a combination for producing a pigment).

(S) A combination of an oxidation precursor of a paraphenylenediamine derivative or a paraaminophenol derivative with a coupling component (a coupler compound).

As the combination of binary components as the above-mentioned color formation source, (A) a combination of an electron-donating dye precursor and an electron-accepting compound; (B) a combination of a diazo compound and a coupling component (hereinafter, sometimes referred to as a coupler compound); (N) a combination of a protected dye (or leuco dye) precursor and a de-protection agent; and (S) a combination of an oxidation precursor of a paraphenylenediamine derivative or a paraaminophenol derivative with a coupling component (a coupler compound) are preferable. That is, as the color-forming component A, an electron-donating dye precursor, a diazo compound, a dye precursor, and an oxidation precursor are preferable and as the color-forming component B, an electron-accepting compound, a coupler compound, and a de-protection agent are preferable.

In the case an electron-donating colorless dye precursor is used as the color-forming component A, examples of the electron-donating colorless dye precursor include a variety of types of compounds already known in thermal recording paper and pressure sensitive paper such as phthalide compounds, fluorane compounds, phenothiazine compounds, indolylphthalide compounds, leuco auamine compounds, rhodamine lactam compounds, triphenylmethane compounds, triazene compounds, spiropyrane compounds, pyridine compounds, pyrazine compounds and fluorene compounds.

The phthalide-based compound include, for example, compounds described in U.S. Pat. No. 23,024, U.S. Pat. Nos. 3,491,111, 3,491,112, 3,491,116, and 3,509,174 and specific examples include 3,3-bis(p-dimethylaminophenyl)-6-dimethylaminophthalide, 3,3-bis(p-diethylaminophenyl) phthalide, 3,3-bis(2-methyl-1-octylindol-3-yl)phthalide, 3-(4-dipropylamino-2-acetylaminophenyl)-3-(2-methyl-1-octylindol-3-yl)-4-azaphthalide, 3-(4-diethylamino-2-ethoxyphenyl)-3-(2-methyl-1-octylindol-3-yl)phthalide, 3-(4-diethylamino-2-ethoxyphenyl)-3-(2-methyl-1-octylindol-3-yl)-4-azaphthalide, 3-(4-diethylamino-2-methylphenyl)-3-(1-ethyl-2-methylindol-3-yl)-4-azaphthalide, 3,3-bis(4-diethylamino-2-butyloxyphenyl)-4-azaphthalide and 3-(4-diethylamino-2-butyloxyphenyl)-3-(2-methyl-1-pentylindol-3-yl)-4-azaphthalide.

Examples of the fluoran-based compound includes compounds described in U.S. Pat. Nos. 3,624,107, 3,627,787, 3,641,011, 3,462,828, 3,681,390, 3,920,510, and 3,959,571 and specific examples are 2-anilino-3-methyl-6-diethylaminofluoran, 2-anilino-3-methyl-6-dibutylaminofluoran, 2-anilino-3-methyl-6-N-ethyl-N-isoamylaminofluoran, 2-anilino-3-methyl-6-N-methyl-N-cyclohexylaminofluoran, 2-anilino-3-methyl-6-N-ethyl-N-isobutylaminofluoran, 2-anilino-6-dibutylaminofluoran and 2-anilino-3-methyl-6-N-methyl-N-tetrahydrofurfurylaminofluoran.

Examples of the thiazine compound include benzoyl Leucomethylene Blue and p-nitrobenzyl Leucomethylene Blue.

Examples of the leuco auamine compound includes, for example, 4,4'-bis-dimethylaminobenzhydrine benzyl ether, N-halophenyl-leuco auramine and N-2,4,5-trichlorophenyl leuco Auramine.

Examples of the rhodamine lactam compound include rhodamine-B-anilinolactam, rhodamine-(p-nitrino)lactam, and the like.

Examples of the spiropyrane compound include compounds described in U.S. Pat. No. 3,971,808 and specific examples are 3-methyl-spiro-dinaphtopyrane, 3-ethyl-spiro-dinaphthopyrane, 3,3'-dichloro-spiro-dinaphthopyrane, 3-benzylspiro-dinaphthopyrane, 3-methyl-naphtho-(3-methoxbenzo)spiropyrane and 3-propyl-spiro-dibenzopyrane.

Examples of the pyridine compound and pyrazine compound include compounds described in U.S. Pat. Nos. 3,775,424, 3,853,869, and 4,246,318.

Examples of the fluorene compound include compounds described in JP-A No. 61-240989.

As the dye precursors for cyan, magenta, or yellow color, the respective dye precursors described in U.S. Pat. No. 4,800,149 can be employed.

Further, as the electron-donating dye precursor for yellow color formation dye, dye precursors described in U.S. Pat. Nos. 4,800,148 and 5,126,233 and JP-B No. 7-88105 are also usable and as the electron-donating dye precursor for cyan color formation dye, dye precursors described in JP-A No. 63-53542 are also usable.

When the above-mentioned electron-donating dye precursors are used, an electron-accepting compound is used as the color-forming component B for color formation the electron-donating dye precursors.

Examples of the electron-accepting compound include electron-accepting compounds already known in thermal recording paper and pressure sensitive paper such as phenol derivatives, salicylic acid derivatives, aromatic carboxylic acid metal salts, acidic white clay, bentonite, novolak resin, metal-treated novolak resin, metal complexes and the like. Specific examples are described in JP-B Nos. 40-9309, 45-14039, JP-A Nos. 52-140483, 48-51510, 57-210886, 58-87089, 59-11286, 60-176795, 61-95988, and the like.

Regarding the above-mentioned compounds, examples of the phenol derivative include 2,2-bis(4-hydroxyphenyl) propane, 1,1-bis(3-chloro-4-hydroxyphenyl)cyclohexane, 4-hydroxyphenyl-4'-isopropyloxyphenyl sulfone, bis(3-allyl-4-hydroxyphenyl)sulfone, $\alpha,\alpha'$-bis(4-hydroxyphenyl) 1,4-diisopropylbenzene and benzyl p-hydroxybenzate.

Examples of the salicylic acid derivative include 4-pentadecylsalicylic acid, 3,5-di($\alpha$-methylbenzyl)salicylic acid, 3,5-di(tert-octyl)salicylic acid, 5-octadecylsalicylic acid, 5-$\alpha$-(p-$\alpha$-methylbenzylphenyl)ethylsalicylic acid, 3-$\alpha$-methylbenzyl-5-tert-octylsalicylic acid, 5-tetradecylsalicylic acid, 4-hexyloxysalicylic acid, 4-cyclohexyloxysalicylic acid, 4-decyloxysalicylic acid, 4-dodecyloxysalicylic acid, 4-pentadecyloxysalicylic acid, 4-octadecyloxysalicylic acid, and their zinc, aluminum, calcium and copper salts like.

In the above-mentioned recording material of the first embodiment, the color-forming component B also functions as a polymerizable compound having an ethylenic unsaturated bond. Accordingly, at least one of polymerizable compounds in the recording material of the first embodiment is an electron-accepting compound which contains an electron-accepting group and an ethylenic unsaturated bond (hereinafter, referred to as a polymerizable group) in the molecule.

Examples of the color-forming component B in this case include 3-halo-4-hydroxybenzoic acid described in JP-A No. 4-226455, methacryloxyethyl ester and acryloxyethyl ester of benzoic acid having hydroxyl as described in JP-A No. 63-173682, esters of benzoic acid having hydroxyl and hydroxymethylstyrene as described in JP-A Nos. 59-83693, 60-141587, and 62-99190, hydroxystyrene described in EP No. 29,323, N-vinylimidazole complex with zinc halide described in JP-A Nos. 62-167077 and 62-16708, and compounds synthesized with reference to the electron-accepting compounds described in JP-A No. 63-317558.

Among these compounds having the electron-accepting group and the polymerizable group in a single molecule, 3-halo-4-hydroxybenzoic acid represented by the following general formula is preferable.

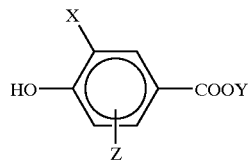

In the above-mentioned formula, X represents a halogen atom and among these, a chlorine atom is preferable; Y represents a monovalent group having the polymerizable ethylene group and among these, aralkyls having vinyl, acryloyloxyalkyls, and methacryloyloxyalkyls are preferable and an acryloyloxyalkyls of 5 to 11 carbon atoms and methacryloyloxyalkyls of 6 to 12 carbon atoms are more preferable. Z represents hydrogen atom, an alkyl or an alkoxy.

Examples of the above-mentioned 3-halo-4-hydroxybenzoic acid include 3-chloro-4-hydroxybenzoic acid vinylphenethyl ester, 3-chloro-4-hydroxybenzoic acid vinylphenylpropyl ester, 3-chloro-4-hydroxybenzoic acid (2-acryloyloxyethyl) ester, 3-chloro-4-hydroxybenzoic acid (2-methacryloyloxyethyl) ester, 3-chloro-4-hydroxybenzoic acid (2-acryloyloxypropyl) ester, 3-chloro-4-hydroxybenzoic acid (2-methacryloyloxypropyl) ester, 3-chloro-4-hydroxybenzoic acid (3-acryloyloxypropyl) ester, 3-chloro-4-hydroxybenzoic acid (3-methacryloyloxypropyl) ester, 3-chloro-4-hydroxybenzoic acid (4-acryloyloxybutyl) ester, 3-chloro-4-hydroxybenzoic acid (4-methacryloyloxybutyl) ester, 3-chloro-4-hydroxybenzoic acid (2-acryloyloxyethyl) ester, 3-chloro-4-hydroxybenzoic acid (5-acryloyloxypentyl) ester, 3-chloro-4-hydroxybenzoic acid (5-methacryloyloxypentyl) ester, 3-chloro-4-hydroxybenzoic acid (6-acyloyloxyhexyl) ester, 3-chloro-4-hydroxybenzoic acid (6-methacryloyloxyhexyl) ester, 3-chloro-4-hydroxybenzoic acid (8-acryloyloxyocty) ester, 3-chloro-4-hydroxybenzoic acid (8-methacryloyloxy) ester and the like.

Further, preferable examples are styrenesulfonylaminosalicylic acid, vinylbenzyloxyphthalic acid, zinc β-methacryloxyethoxysalicylate, zinc β-acryloxyethoxysalicylate, vinyloxyethyloxybenzoic acid, β-methacryloxyethyl orcsellinate, β-acryloxyethyl orcsellinate, β-methacryloxyethoxyphenol, β-acryloxyethoxyphenol, β-methacryloxyethyl-β-resorcinate, β-acryloxyethyl-β-resorcinate, hydroxystyrenesulfonic acid-N-ethylamide, β-methacryloxypropyl-p-hydroxybenzoate, β-acyloxypropyl-p-hydroxybenzoate, methacryloxymethylphenol, acryloxymethylphenol, methacrylamidopropanesulfonic acid, acrylamidopropanesulfonic acid, β-methacryloxyethoxy-dihydroxybenzene, β-acryloxyethoxy-dihydroxybenzene, γ-styrenesulfonyloxy-β-methacryloxypropanecarboxylic acid, γ-acryloxypropyl-α-hydroxyethyloxysalicylic acid, β-hydroxyethoxyphenol, β-methacryloxyethyl-p-hydroxycinnamate, β-acryloxyethyl-p-hydroxycinnamate, 3,5-distyrenesulfonic acid amidophenol, methacryloxyethoxyphthalic acid, acryloxyethoxyphthalic acid, methacrylic acid, acrylic acid, methacryloxyethoxyhydroxynaphthoic acid, acryloxyethoxyhydroxynaphthoic acid, 3-β-hydroxyethoxyphenol, β-methacryloxyethyl-p-hydroxybenzoate, β-acryloxyethyl-p-hydroxybenzoate, β'-methacryloxyethyl-β-resorcinate, β-methacryloxyethyloxycarbonylhydroxybenzoic acid, β-acryloxyethyloxycarbonylhydroxybenzoic acid, N,N'-di-β-methacryloxyethylaminosalicylic acid, N,N'-di-β-acryloxyethylaminosalicylic acid, N,N'-di-β-methacryloxyethylaminosulfonylsalicylic acid, N,N'-di-β-acryloxyethylaminosulfonylsalicylic acid, and their metal salts thereof (e.g. zinc salts).

In the case when an electron-donating dye precursor is used as the color-forming component A and an electron-accepting compound is used as the color-forming component B, the amount of the above-mentioned electron-donating dye precursor in the recording layer is preferably 0.05 to 5 g/m² and more preferably 0.1 to 3 g/m².

Meanwhile, the amount of the above-mentioned electron-accepting compound is preferably 0.5 to 20 parts by weight and more preferably 3 to 10 parts by weight to 1 part by weight of the electron-donating colorless dye to be used. If the amount used is less than 0.5 parts by weight, sufficient color density cannot be obtained in some cases and if it exceeds 20 parts by weight, the sensitivity is decreased or the application suitability is deteriorated in some cases.

In the case a diazo compound is used as the color-forming component A, a compound having the following formula is preferably employed.

(in the formula, Ar represents an aromatic group and Y⁻ represents an acid anion.)

In the above-mentioned formula, Ar represents a substituted or an unsubstituted aryl. Examples of the substituent group include alkyl, alkoxy, alkylthio, aryl, aryloxy, arylthio, acyl, alkoxycarbonyl, carbamoyl, carboamide, sulfonyl, sulfamoyl, sulfonamido, ureido, halogen, amino and heterocyclic groups, and these substituent groups may be further substituted.

The aryl is preferably an aryl of 6 to 30 carbon atoms and examples thereof include phenyl, 2-methylphenyl, 2-chlorophenyl, 2-methoxyphenyl, 2-butoxyphenyl, 2-(2-ethylhexyloxy)phenyl, 2-octyloxyphenyl, 3-(2,4-di-tert-pentylphenoxyethoxy)phenyl, 4-chlorophenyl, 2,5-dichlorophenyl, 2,4,6-trimethylphenyl, 3-chlorophenyl, 3-methylphenyl, 3-methoxyphenyl, 3-butoxyphenyl, 3-cyanophenyl, 3-(2-ethylhexyloxy)phenyl, 3,4-dichlorophenyl, 3,5-dichlorophenyl, 3,4-dimethoxyphenyl, 3-(dibutylaminocarbonylmethoxy)phenyl, 4-cyanophenyl, 4-methylphenyl, 4-methoxyphenyl, 4-butoxyphenyl, 4-(2-ethylhexyloxy)phenyl, 4-benzylphenyl, 4-aminosulfonylphenyl, 4-N,N-dibutylaminosulfonylphenyl, 4-ethoxycarbonylphenyl, 4-(2-ethylhexylcarbonyl)phenyl, 4-fluorophenyl, 3-acetylphenyl, 2-acetylaminophenyl, 4-(4-chlorophenylthio)phenyl, 4-(4-methylphenyl)thio-2,5-butoxyphenyl and 4-(N-benzyl-N-methylamino)2-dodecyloxycarbonylphenyl.

These groups may be further substituted with an alkyloxy, an alkylthio, a substituted phenyl, a cyano, a substituted amino, a halogen, a heterocyclic group and the like.

Preferable examples of the diazo compound to be used as the color-forming component A include diazo compounds exemplified in the 44th to 49th paragraphs in JP-A No.

7-276808. However, in the invention, the diazo compound is not limited to those compounds.

The maximum absorption wavelength $\lambda_{max}$ of the diazo compound is preferably 450 nm or shorter and more preferably to be 290 to 440 nm in views of the effects. Further, the diazo compounds preferably contains 12 or more carbon atoms and has 1% or less solubility in water, and 5% or more solubility in ethyl acetate.

Incidentally, the diazo compound used as the color-forming component A may be used alone or in combination with another or other kinds depending on various purposes such as hue adjustment and the like.

In the case when the above-mentioned diazo compound is used, a coupler compound (having no polymerizable group) or a coupler compound having a polymerizable group is used as the color-forming component B.

The above-mentioned coupler compound is a compound forming a dye by coupling with a diazo compound in a basic atmosphere and/or a neutral atmosphere and a plurality of types may be used in combination depending on various purposes such as hue adjustment and the like.

Specific examples of the above-mentioned coupler compound having a polymerizable group include so-called activated methylene compounds having a methylene group adjacent to carbonyl, phenol derivatives, naphthol derivatives, azole derivatives, condensed heteroring azole derivatives and the like. They may be properly selected to the extent to satisfy the purposes of the invention.

As a coupler skeleton compound (a coupler) in the above-mentioned coupler compound having a polymerizable group, it is preferable to use a so-called activated methylene compound having methylene group adjacently to carbonyl, phenol derivatives, naphthol derivatives, azole derivatives, or condensed heteroring azole derivatives. Specific examples of these compounds include resorcin, phloroglucin, 2,3-dihydroxynaphthalene, sodium 2,3-dihydroxynaphthalene-6-sulfonate, 1-hydroxy-2-naphthoic acid morpholinopropylamide, sodium 2-hydroxy-3-naphthalenesulfonate, 2-hydroxy-3-naphthalenesulfonic acid anilide, 2-hydroxy-3-naphthalenesulfonic acid morpholinopropylamide, 2-hydroxy-3-naphthalenesulfonic acid-2-ethylhexyloxypropylamide, 2-hydroxy-3-naphthalenesulfonic acid-2-ethylhexylamide, 5-acetamide-1-naphthol,
sodium 1-hydroxy-8-acetamidonaphthalene-3,6-disulfonate, 1-hydroxy-8-acetamidonaphthalene-3,6-disulfonic acid dianilide, 1,5-dihydroxynaphthalene, 2-hydroxy-3-naphthoic acid morpholinopropylamide, 2-hydroxy-3-naphthoic acid octylamide, 2-hydroxy-3-naphthoic acid anilide, 5,5-dimethyl-1,3-cyclohexanedione, 1,3-cyclopentanedione, 5-(2-n-tetradecyloxyphenyl)-1,3-cyclohexanedione, 5-phenyl-4-methoxycarbonyl-1,3-cyclohexanedione, 5-(2,5-di-n-octyloxyphenyl)-1,3-cyclohexanedione, N,N'-dicyclohexylbarbituric acid, N,N'-di-n-dodecylbarbituric acid, N-n-octyl-N'-n-octadecylbarbituric acid, N-phenyl-N'-(2,5-di-n-octyloxyphenyl)barbituric acid, N,N'-bis (octadecyloxycarbonylmethyl)barbituric acid, 1-phenyl-3-methyl-5-pyrazolone, 1-(2,4,6-trichlorophenyl)-3-anilino-5-pyrazolone, 1-(2,4,6-trichlorophenyl)-3-benzamido-5-pyrazolone, 6-hydroxy-4-methyl-3-cyano-1-(2-ethylhexyl)-2-pyridone, 2,4-bis(benzoylacetamido)toluene, 1,3-bis (pivaloylacetamidomethyl)benzene, benzoylacetonitrile, thenoylacetonitrile, acetoacetoanilide, benzoylacetoanilide, pivaloylacetoanilide, 2-chloro-5-(N-n-butylsulfamoyl)-1-pivaloylacetamidobenzene, 1-(2-ethylhexyloxypropyl)-3-cyano-4-methyl-6-hydroxy-1,2-dihydropyridin-2-one, 1-(dodecyloxypropyl)-3-acetyl-4-methyl-6-hydroxy-1,2-dihydropyridin-2-one and 1-(4-n-octyloxyphenyl)-3-tert-butyl-5aminopyrazole.

Details of the coupler compounds can be found by referring to the compounds described in JP-A Nos. 4-201483, 7-223367, 7-223368, 7-323660, 5-278608, 5-297024, 6-18669, 6-18670, 7-316280, 9-216468, 9-216469, 9-319025, 10-035113, 10-193801, 10-264532, and the like.

The coupler compounds form dyes by coupling with a diazo compound in basic atmosphere and/or neutral atmosphere and a plurality of types may be used in combination depending on various purposes such as hue adjustment and the like.

Hereinafter, specific examples of the coupler having a polymerizable group will be shown, however in the invention, the coupler is not limited to these examples.

B-1

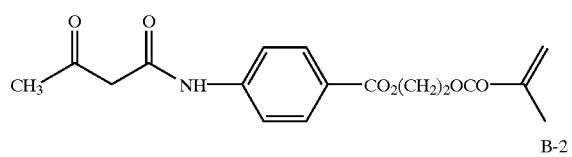

B-2

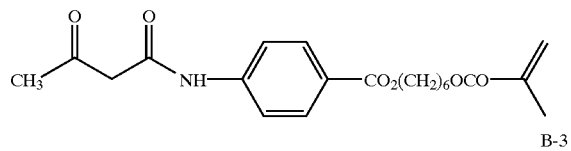

B-3

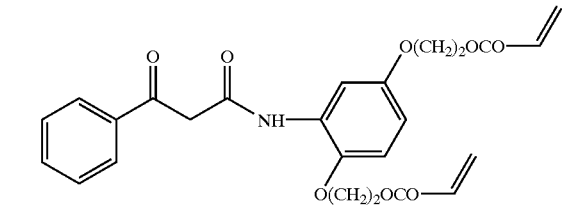

B-4

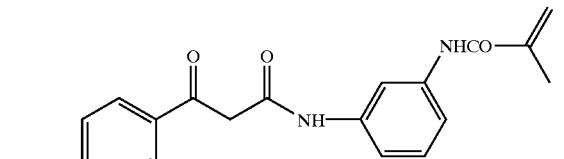

B-5

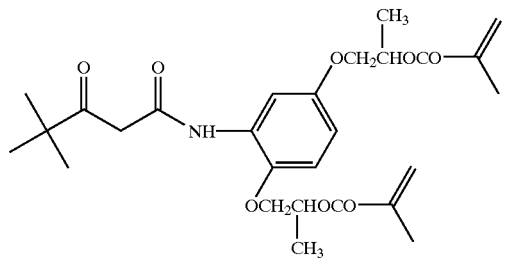

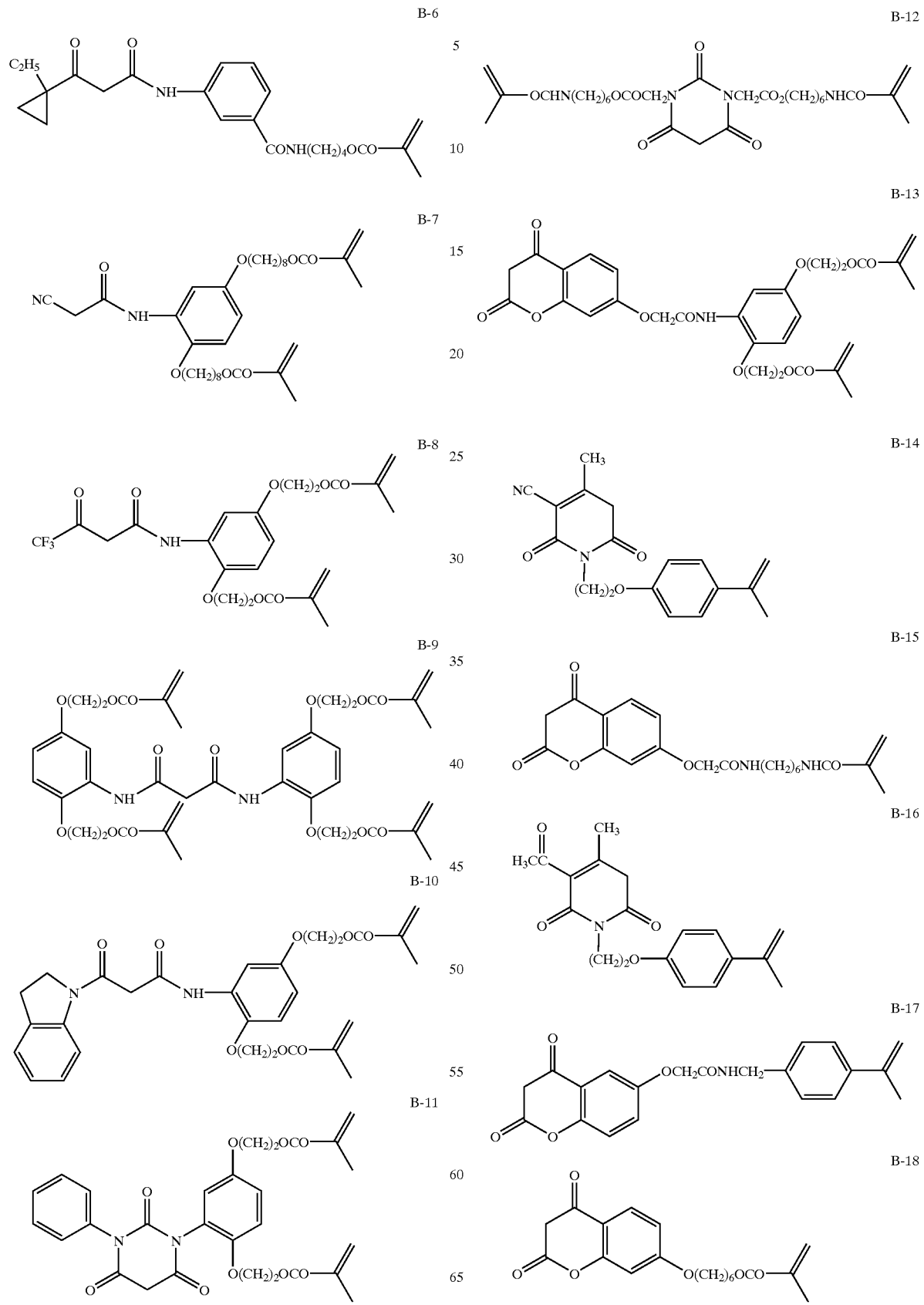

B-19
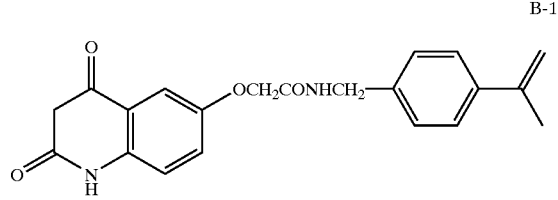
B-20
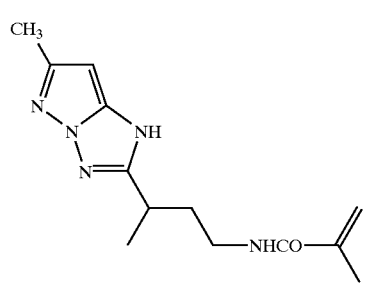
B-21
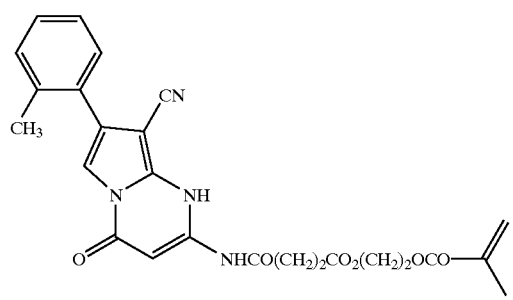
B-22
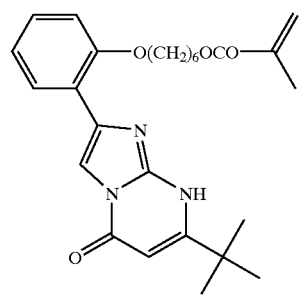
B-23
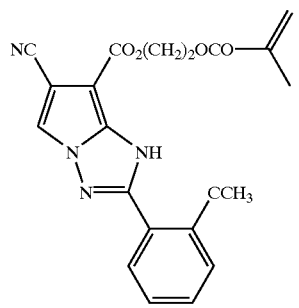
B-24
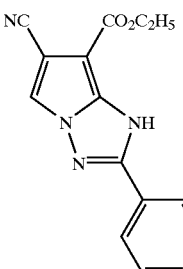
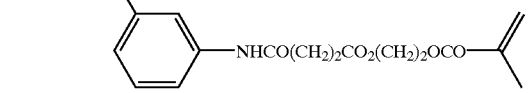
B-25
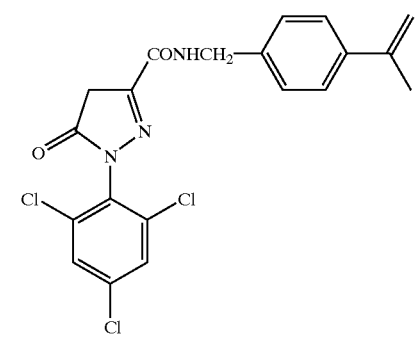
B-26
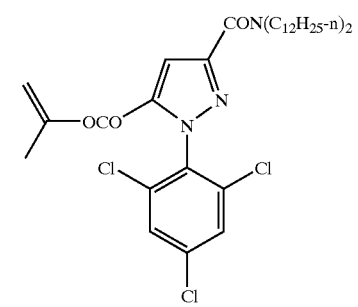
B-27
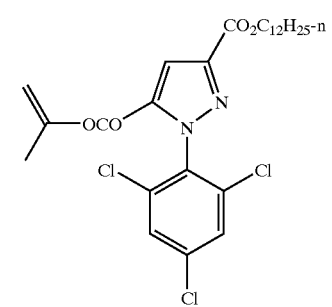
B-28
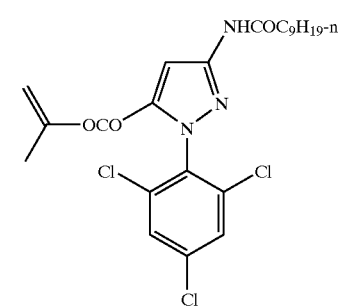

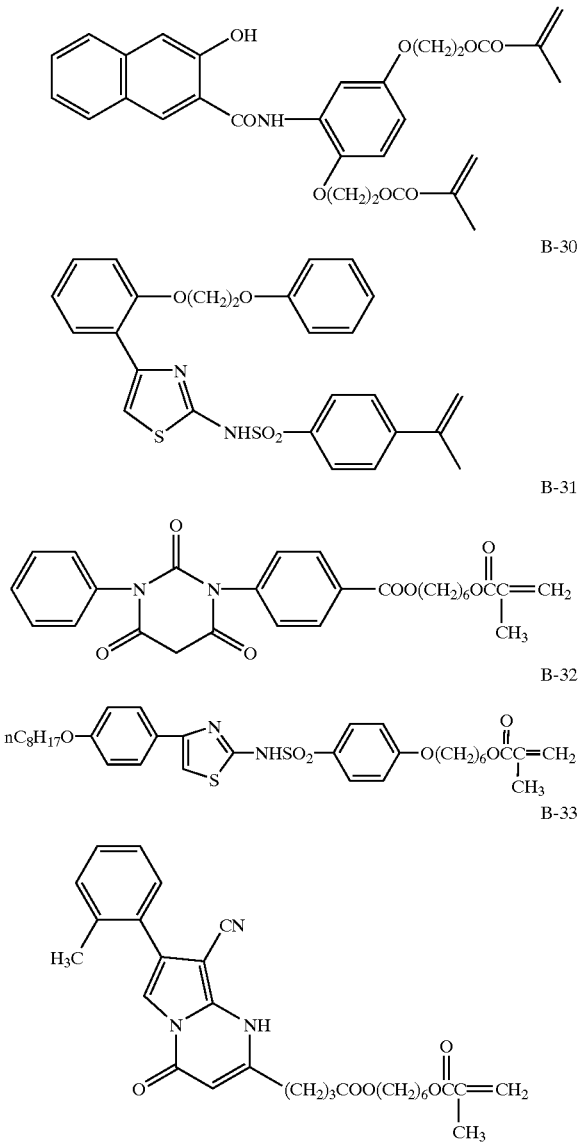

Specific examples of the coupler compound having no polymerizable group include the compounds exemplified as the coupler skeleton compounds in the above-mentioned coupler compound, which has a polymerizable group.

When a diazo compound is used as the color-forming component A and a coupler as the color-forming component B, the content of the above-mentioned diazo compound in the recording layer is preferably 0.02 to 5.0 g/m² and more preferably 0.05 to 3.0 g/m².

If the content is less than 0.02 g/m², sufficient color density cannot be obtained in some cases and if it exceeds 5.0 g/m², the application suitability of a coating solution may deteriorated.

Further, the amount of the above-mentioned coupler compound used is preferably 0.5 to 20 parts by weight and more preferably 1 to 10 parts by weight to 1 part by weight of the above-mentioned diazo compound. If the amount used is less than 0.5 parts by weight, sufficient coloration might not be obtained and if it exceeds 20 parts by weight, the application suitability might deteriorate.

The coupler compound to be used as the color-forming component B may be added to a water-soluble polymer and other components to be used and solid-dispersed by a sand mill, and may also be used in the form of an emulsion by being emulsified together with a appropriate emulsification auxiliary agent. The method for solid-dispersion or emulsification is not particularly limited and any well-known method may be employed. The details of the methods are described in JP-A Nos. 59-190886, 2-141279, and 7-17145.

For the purpose of promoting a coupling reaction between a diazo compound and a coupler, it is preferable to use organic base compounds such as tertiary amines, piperidines, piperazines, amizines, formamizines, pyridines, guanidines, morpholines and the like.

The above-mentioned organic base compounds include piperazines such as N,N'-bis(3-phenyoxy-2-hydroxypropyle)piperazine, N,N'-bis[3-(p-methylphenyloxy)-2-hydroxypropyle]piperazine, N,N'-bis[3-(p-methoxyphenyloxy)-2-hydroxypropyle]piperazine, N,N'-bis(3-phenylthio-2-hydroxypropyle)piperazine, N,N'-bis[3-(β-naphthoxy)-2-hydroxypropyle]piperazine, N-3-(β-naphthoxy)-2-hydroxypropyle-N'-methylpiperazine, piperazines such as 1,4-bis{[3-(N-methylpiperadino)-2-hydroxy]propyloxy}benzene and the like; morpholines such as N-[3-(β-naphthoxy)-2-hydroxy]propylmorpholine, 1,4-bis[(3-morpholino-2-hydroxy)propyloxy]benzene, and 1,3-bis[(3-morpholino-2-hydroxy)propyloxy]benzene and the like; piperidines such as N-(3-phenoxy-2-hydroxypropyl)piperidine, N-dodecylpiperidine and the like; triphenylguanidine, tricyclohexylguanidine, dicyclohexylphenylguanidine, 4-hydroxybenzoic acid 2-N-methyl-N-benzylaminoethyl ester, 4-hydroxybenzoic acid 2-N,N-di-n-butylaminoethyl ester, 4-(3-N,N-dibutylaminopropoxy)benzenesulfonamide, 4-(2-N,N-dibutylaminoethoxycarbonyl)phenoxyacetic acid amide and the like.

These organic base compounds may be used singly or in combinations of two or more.

These compounds are described in JP-A Nos. 57-123086, 60-49991 and 60-94381, Japanese Patent Application Nos. 7-228731, 7-235157 and 7-235158, and the like.

In the case when the above-mentioned organic base compounds are used, organic base compounds having a polymerizable group may be used as the organic base compounds.

In the case when an organic base compound having a polymerizable group is used for the above-mentioned recording material of the first embodiment, a diazo compound and a coupler may be enencapsulated together, as the color-forming component A, in a microcapsule and the organic base compound, which has a polymerizable group, may be used as the above-mentioned color-forming component B. In the case when a diazo compound and a coupler are enencapsulated together in a microcapsule as the color-forming component A, the diazo compound and the coupler are used in a combination in which no coloration reaction takes place unless a base compound exists.

Further, in the above-mentioned recording material of the first embodiment, it is also possible that a diazo compound is used as the color-forming component A and a coupler having a polymerizable group and an organic base compound having a polymerizable group are used together in combination as the above-mentioned color-forming component B.

The amount of the above-mentioned organic base compound used is not particularly limited, however, it is preferably used in a range of 1 to 30 moles to 1 mole of the diazo compound.

Further, for the purpose of promoting the coloration reaction, a color formation auxiliary agent may be added.

The color formation auxiliary agent includes phenol derivatives, naphthol derivatives, alkoxy-substituted benzenes, alkoxy-substituted naphthalenes, hydroxycompounds, carboxylic acid amide compounds, sulfonamide compounds and the like.

Next, a polymerizable compound to be employed for the recording material of the second embodiment will be described.

In the above-mentioned recording material of the second embodiment, the recording layer contains, as the polymerizable compound, a color formation suppressing compound, which has a site for suppressing the reaction of the color-forming component A and the color-forming component B that reacts with the color-forming component A to form a color and an ethylenic unsaturated bond in a single molecule (hereinafter, sometimes referred to as a polymerizable color formation suppressing compound).

In the case when an electron-donating dye precursor is used as the above-mentioned color-forming component A and an electron-accepting compound having no polymerizable group is used as the above-mentioned color-forming component B, it is preferable to use, as the polymerizable color formation suppressing compound, a photopolymerizable monomer having a site for suppressing reactions between the electron-donating dye precursor and the electron-accepting compound and at least one vinyl group in a molecule (hereinafter, sometimes referred to as photopolymerizable monomer $D_1$).

Specific examples of the above-mentioned photopolymerizable monomer $D_1$ include acrylic acid and its salts, acrylic acid esters, acrylamides; methacrylic acids and salts thereof, methacrylic acid esters, methacrylamides; maleic anhydride, maleic acid esters; itaconic acid, itaconic acid esters; styrenes; vinyl ethers; vinyl esters; N-vinyl-heterocyclic compounds; aryl ethers; and allyl esters.

Among these, compounds having a plurality of vinyl groups in a molecule are preferable and specifically, acrylic acid esters and/or methacrylic acid esters with polyhydric alcohols such as trimethylolpropane, pentaerythritol and the like; acrylic acid esters and/or methacrylic acid esters with polyhydric phenols and bisphenols such as resorcinol, pyrogallol, phloroglucinol, and the like; acrylate or methacrylate-terminated epoxy resin; acrylate or methacrylate-terminated polyesters are preferable.

Among the above-mentioned compounds, ethylene glycol diacrylate, ethylene glycol dimethacrylate, trimethylolpropane triacrylate, pentaerythritol tetraacrylate, dipentaerythritol hydroxypentaacrylate, hexanediol-1,6-dimethacrylate, or diethylene glycol dimethacrylate are especially preferable.

As the above-mentioned photopolymerizable monomer $D_1$, those having a molecular weight about 100 to 5,000 are preferable and about 300 to 2,000 are more preferable.

In the case when the above-mentioned photopolymerizable monomer $D_1$ is used as the above-mentioned polymerizable color formation suppressing compound, the amount used is preferably 0.1 to 10 parts by weight and more preferably 0.5 to 5 parts by weight to 1 part by weight of the electron-donating compound to be used in combination with the coupler compound having no polymerizable group. If the above-mentioned use amount is less than 0.1 parts by weight, a latent image might not be formed in the exposure step and if it exceeds 10 parts by weight, the color density might decrease.

In the case when the diazo compound is used as the above-mentioned color-forming component A and the coupler compound having no polymerizable group is used as the above-mentioned color-forming component B, it is preferable to use, as the polymerizable color formation suppressing compound, a photopolymerizable monomer having an acidic group for suppressing the coupling reaction between the diazo compound and the coupler compound and at least one vinyl group in a molecule (hereinafter, sometimes referred to as photopolymerizable monomer $D_2$).

Preferable examples of the above-mentioned photopolymerizable monomer $D_2$ include styrenesulfonylaminosalicylic acid, vinylbenzyloxyphthalic acid, zinc β-methacryloxyethoxysalicylate, zinc β-acryloxyethoxysalicylate, vinyloxyethyloxybenzoic acid, β-methacryloxyethylorsellinate, β-acryloxyethylorsellinate, β-methacryloxyethoxyphenol, β-acryloxyethoxyphenol, β-methacryloxyethoxyl-β-resorcinate, β-acryloxyethoxyl-β-resorcinate, hydroxystyrenesulfonic acid-N-ethylamide, β-methacryloxypropyl-p-hydroxybenzoate, β-acryloxypropyl-p-hydroxybenzoate, methacryloxymethylphenol, acryloxymethylphenol, methacrylamidopropanesulfonic acid, acrylamidopropanesulfonic acid, β-methacryloxyethoxy-dihydroxybenzene, β-acryloxyethoxy-dihydroxybenzene, γ-styrenesulfonyloxy-β-methacryloxypropanecarboxylic acid, γ-acryloxypropyl-α-hydroxyethyloxysalicylic acid, β-hydroxyethoxyphenol, β-methacryloxyethyl-p-hydroxycinnamate, β-acryloxyethyl-p-hydroxycinnamate, 3,5-distyrenesufonic acid amidophenol, methacryloxyethoxyphthalic acid, acryloxyethoxyphthalic acid, methacrylic acid, acrylic acid, methacryloxyethoxyhydroxynaphthoic acid, acryloxyethoxyhydroxynaphthoic acid, 3-β-hydroxyethoxyphenol, β-methacryloxyethyl-p-hydroxybenzoate, β-acryloxyethyl-p-hydroxybenzoate, β'-methacryloxyethyl-β-resorcinate, β-methacryloxyethyloxycarbonylhydroxybenzoic acid, β-acryloxyethyloxycarbonylhydroxybenzoic acid, N,N-di-β-methacryloxyethylaminosalicylic acid, N,N-di-β-acryloxyethylaminosalicylic acid, N,N-di-β-methacryloxyethylaminosulfonylsalicylic acid and N,N-di-β-acryloxyethylaminosulfonylsalicylic acid.

In the case when the above-mentioned photopolymerizable monomer $D_2$ is used as the above-mentioned polymerizable color formation suppressing compound, the amount used is preferably 0.1 to 10 parts by weight and more preferably 0.5 to 5 parts by weight to 1 part by weight of the coupler compound to be used in combination with the coupler compound having no polymerizable group. If the above-mentioned use amount is less than 0.1 parts by weight, an latent image might not be formed in the exposure step and if it exceeds 10 parts by weight, the color density might be decreased.

Microcapsules:

In the recording material of the invention, it is preferable to add the color-forming component A in the above-mentioned recording layer while enencapsulating the color-forming component A in microcapsules.

As the method for encapsulation, any well-known method can be employed. Examples include: methods utilizing coacervation of hydrophilic wall forming materials as described in U.S. Pat. Nos. 2,800,457 and 2,800,458; interfacial polymerization methods as described in U.S. Pat. No. 3,287,154, U.K. Patent No. 990,443, and JP-B Nos. 38-19574, 42-446 and 42-771; methods for polymer precipitation as described in U.S. Pat. Nos. 3,418,250 and 3,660,304; methods using isocyanate polyol wall materials as described in used U.S. Pat No. 3,796,669; methods using isocyanate wall materials as described in U.S. Pat. No. 3,914,511; methods using urea-formaldehyde-based, ureaformaldehyde-resorcinol-based wall forming materials as described in U.S. Pat. Nos. 4,001,140, 4,087,376, and 4,089,802; methods using wall forming materials such as melamine-formaldehyde resin, hydroxy propyl cellulose and the like as described in U.S. Pat. No. 4,025,455; in situ methods comprising monomer polymerization as described in JP-B No. 36-9168 and JP-A No. 51-9079; electrolysis dispersion cooling methods as described in U.K. Patent Nos. 952,807 and 965,074; spray drying methods as described in U.S. Pat. No. 3,111,407 and U.K. Patent No. 930,422 and the like.

The method for encapsulation is not limited to these methods, however, an interface polymerization method comprising steps of mixing an oil phase produced by dissolving or dispersing the color-forming component A in a hydrophobic organic solvent, which will become a core of the capsule, with a water phase dissolving a water-soluble polymer, emulsifying and dispersing the mixture by means such as a homogenizer or the like and then causing a polymer forming reaction at an oil droplet interface by heating the mixture to form a microcapsule wall of the polymer substance is especially preferable. With this method, capsules with uniform particle diameter can be formed within a short time and accordingly the recording material can be provided with excellent raw storage property.

The reactants for forming the polymer may be added to the inside of the oil droplets and/or the outside of the oil droplets. Specific examples of the polymer substance include polyurethanes, polyureas, polyamides, polyesters, polycarbonates, urea-formaldehyde resin, melamine resin, polystyrenes, styrene-methacrylate copolymers and styrene-acrylate copolymers. Among these, polyurethanes, polyureas, polyamides, polyesters, and polycarbonates are preferable and polyurethanes and polyureas are especially preferable. Two or more types of the above-mentioned polymer substances may be used in combination.

Examples of the above-mentioned water-soluble polymer include gelatin, polyvinyl pyrrolidone and polyvinyl alcohol. For example, in the case when a polyurethane is used for the capsule wall material, a polyvalent isocyanate and a second substance, which forms a capsule wall by reacting with the isocyanate (e.g. a polyol, a polyamine) are mixed in an aqueous solution of a water-soluble polymer (water phase) or an oleophilic solvent (oil phase) to be encapsulated and the mixture is emulsified and dispersed and then heated to cause a polymer forming reaction in the oil droplet interface and consequently, the microcapsule wall can be formed.

The above-mentioned polyvalent isocyanate and the counterpart polyol, polyamine to be reacted to the isocyanate may be selected from those described in U.S. Pat. Nos. 3,281,383, 3,773,695, and 3,793,268, JP-B Nos. 48-40347 and 49-24159, and JP-A Nos. 48-80191 and 48-84086.

At the time of producing the microcapsule containing the color-forming component A, the color-forming component A to be enencapsulated in the microcapsule may exist in solution state in the capsule or in solid state in the capsule.

In the case when the color-forming component A is enencapsulated in the solution state in the microcapsule, the color-forming component A may be enencapsulated in state dissolved in a hydrophobic organic solvent. The amount of the organic solvent used is preferably 1 to 500 parts by weight to 100 parts by weight of the color-forming component A.

The above-mentioned hydrophobic organic solvent is generally a phosphoric acid ester, a phthalic acid ester, an acrylic acid ester, a methacrylic acid ester, another carboxylic ester, an fatty acid amide, an alkylated diphenyl, an alkylated terphenyl, a chlorinated paraffin, an alkylated naphthalene, a diallylethane, a solid at a normal temperature, an oligomer oil, a polymer oil and the like. Specific examples include organic solvents described in JP-A Nos. 59-178451 to 59-178455, 59-178457, 60-242094, 63-85633, 6-194825, 7-13310 to 7-13311, 9-106039, and Japanese Patent Application No. 62-75409.

In the case when the solubility of the color-forming component A to be enencapsulated is low in the above-mentioned organic solvent, a low boiling point solvent in which the solubility is high may be used together. Examples of the low boiling point solvent include ethyl acetate, propyl acetate, isopropyl acetate, butyl acetate and methylene chloride.

However, for the water phase to be employed, an aqueous solution, in which a water-soluble polymer is dissolved, is used and the above-mentioned oil phase is added to the water phase. Afterwards, the resulting mixture is emulsified and dispersed by means such as a homogenizer or the like and in this case, the water-soluble polymer works as a dispersant for carrying out dispersion evenly and easily and also stabilizing the emulsified and dispersed aqueous solution. In order to further evenly emulsify and disperse the mixture and stabilize the resulting emulsion, a surfactant may be added to at least one of the oil phase and the water phase. Any well-known surfactant for emulsification may be used as the surfactant. Further, in the case when a surfactant is added, the amount of the surfactant added is 0.1% to 5%, and especially preferably 0.5% to 2%, to the weight of the oil phase.

In the case when the color-forming component A is enencapsulated in a microcapsule, the average particle diameter of the microcapsule is preferably 20 $\mu$m or smaller and more preferably 5 $\mu$m or smaller in terms of achieving of a high degree of resolution. If the formed microcapsule is too small, the surface area per a given amount of the solid matter is increased and thus a large quantity of a wall agent is required, so that the above-mentioned average particle diameter is preferably 0.1 $\mu$m or larger.

The photopolymerizable composition of the invention can be applied to a wide range of fields including inks, color filters, holograms, proofs, sealants, adhesives, planographic printings, resin relief printing plates and photoresist other than the above-mentioned recording material of the invention and depending on the respective purposes, other components may be added. Further, in cases when the photopolymerizable composition is used in applications other than the recording material of the invention, 3) the polymerizable compound is not required to function as the color-forming component B and the color formation suppressing compound described above, and therefore, any polymerizable compound having an ethylenic unsaturated bond may be used optionally.

In the case of a multi-color recording material, the multi-color recording material comprises a plurality of monochromatic recording layers layered on a substrate in which each layer contains a color-forming component A (optionally enencapsulated in a microcapsule), which each has a different color formation hue, a color-forming component B (optionally having a polymerizable group) having a site for color formation by reaction with each of the color-forming component A in a molecule, and a photopolymerizable composition photosensitive to light, each of which is photosensitive to a different wavelength to form a latent image. That is, a spectral sensitizing dye having a different absorption wavelength is used for each photopolymerizable composition to give each photopolymerizable composition photosensitivity to light of a different wavelength. In this case, intermediate layers may be formed between respectively adjacent monochronous recording layers.

The recording layers of the multi-color multi-layer recording material, for example, can be formed as follows.

A first recording layer containing a microcapsule enencapsulating a yellow-color formation color-forming component $A^Y$, a color-forming component $B^Y$ for color formation the color-forming component $A^Y$, and a photopolymerizable composition photosensitive to light with a center wavelength $\lambda_1$ to form a latent image is formed on a substrate: a second recording layer containing a microcapsule enencapsulating a magenta-color formation color-forming component $A^M$, a color-forming component $B^M$ for color formation the color-forming component $A^M$, and a photopolymerizable composition photosensitive to light with a center wavelength $\lambda_2$ to form a latent image is formed on the first layer: a third recording layer containing a microcapsule enencapsulating a cyan-color formation color-forming component $A^C$, a color-forming component $B^C$ for color formation the color-forming component $A^C$, and a photopolymerizable composition photosensitive to light with a center wavelength $\lambda_3$ to form a latent image is formed on the second layer to form a multi-layer recording layer $\alpha$ with a layer structure and if necessary, intermediate layers may be formed between respectively neighboring layers of the multi-layer structure to form a recording layer $\beta$.

In the case of image formation using the recording material having the above-mentioned multi-color multi-layer recording layer, image exposure is carried out using a plurality of light sources with different wavelength corresponding to the absorption wavelength of each recording layer during the imagewise exposure process to respectively and selectively form latent images in the respective recording layers having the absorption wavelength of the light sources, so that a multi-color image can be formed with a remarkably high sensitivity and high clearness and further by light radiation to the entire surface of the recording layers, the coloration of the non-image area due to the photopolymerizable compositions containing spectral sensitizing dyes or the like remaining in the layers can be decolorized to give a multi-color image with a high image quality and a high contrast.

Substrate:

For the above-mentioned substrate, any of the paper substrates employed by common pressure sensitive paper, thermal recording paper, and dry or wet type diazo copying paper can be employed. In addition, acidic paper, neutral paper, coated paper, plastic film-laminated paper, synthetic paper and plastic films also may be used.

The recording material of the invention can be suitably used for planographic printing, resin relief printing plate, resists and photo masks for printed board manufacture, sheets for black and white or color transfer coloration, color formation sheet production and the like. For example, in the case when the recording material of the invention is used for the photosensitive and heat-sensitive color formation sheet, the respective components are dissolved or dispersed in appropriate solvents independently or in combination with other types of components to prepare solutions or dispersions and are mixed to obtain coating solutions. Then the coating solutions are applied to a substrate of, for example, paper or a plastic film, and dried to obtain the recording material. For example, in the case when a predetermined component is enencapsulated, a dispersion of the microcapsule enencapsulating the component is prepared and a solution or a dispersion in which another component is dissolved or dispersed is separately prepared and these are mixed to obtain a coating solution. In the preparation of the coating solution, the respective components can be kept in preferable dispersion state using a homogenizer or the like.

As the application and drying method, any well-known method can be employed.

The recording material of the invention can be used for image formation by carrying out exposure for latent image formation and thermal development simultaneously with or after the exposure.

As the heating method at the time of the thermal development, any well-known method can be employed and generally, the heating temperature is preferably 80 to 200° C. and more preferably 85 to 130° C. The heating period is preferably 1 to 5 seconds and more preferably 3 seconds to 1 minute.

After the thermal development, it is preferable to radiate light to the entire surface of the recording material to carry out polymerization in the area where polymerization is not carried out to fix the formed image and to decolorize, decompose, or deactivate the component such as a spectral sensitizing dye, which component remainins in the recording layer and lowers the whiteness of the non-image area.

The recording material of the invention is enabled to prevent color from remaining in the non-image area to and improve the whiteness degree of the non-image area with a shorter image fixing treatment than that for a conventional one.

Further, in the case of image formation by the above-mentioned method, the sensitivity can be further improved by setting a step of evenly preheating the entire face of the material during the above-mentioned image formation at a prescribed temperature lower than the coloration temperature. Further, not only the above-mentioned recording method but also any other well-known recording method can be employed.

As described above, the invention provides a recording material with which it is made possible to carry out image recording with a high sensitivity using not only UV rays but also visible light rays to IR rays in a completely dry treatment system, in which no development solution is required to use and accordingly no waste is generated and which has an excellent raw storage property.

Especially, in the case the recording material is a multi-layer recording material, interlayer diffusion can be inhibited and deterioration of the raw storage property can be prevented.

EXAMPLES

Hereinafter, examples of the present invention will be described, however the invention is not limited to these examples. Note that in the following examples, the character "%" means "% by weight" and the term "part" means "part by weight" unless specifically stated otherwise.

At first, the organic dyes (1), (2), and a photoradical generating agents (1) to (3) used for the following respective examples and comparative examples will be shown below.

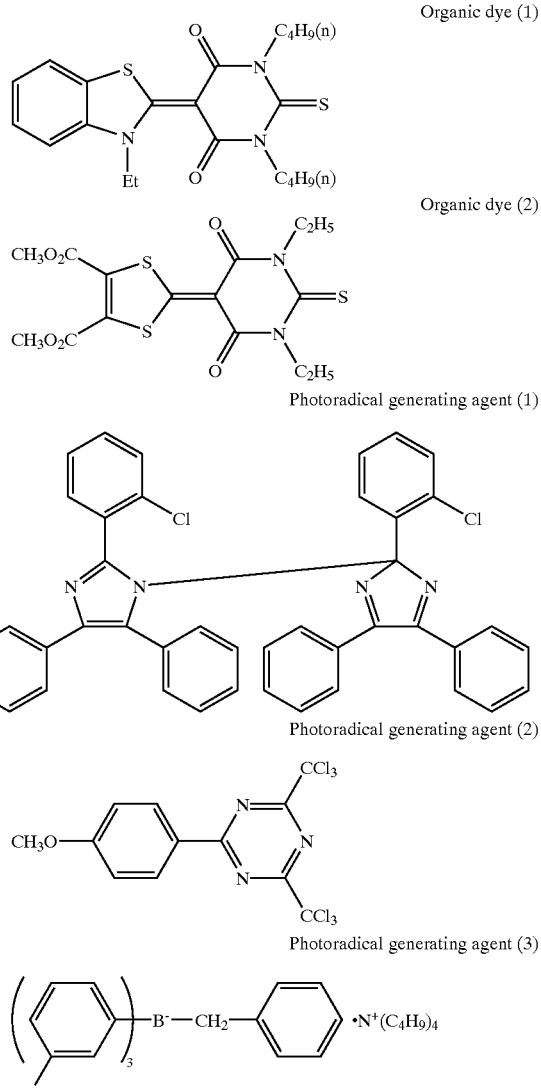

Organic dye (1)

Organic dye (2)

Photoradical generating agent (1)

Photoradical generating agent (2)

Photoradical generating agent (3)

Examples 1 to 7

The following photopolymerizable compositions were produced using organic dyes, photoradical generating agents, and thiol compounds shown in Table 1. The numerals shown in the columns of the organic dyes and the photoradical generating agents shown in the following Table 1 corresponds to the above-shown respective compound nos. and the numerals shown in the column of the thiol compounds are correspond to the above exemplified compound nos.

| Photopolymerizable Composition | |
|---|---|
| pentaerythritol tetraacrylate | 1.41 g |
| benzyl methacrylate/methacrylic acid copolymer (mole ratio 73/27 copolymer) | 1.29 g |
| methyl ethyl ketone | 12 g |
| propylene glycol monomethyl ether acetate | 8.62 g |
| organic dye | (refer to Table 1) |
| photoradical generating agent | (refer to Table 1) |

-continued

| Photopolymerizable Composition | |
|---|---|
| thiol compound | (refer to Table 1) |
| methanol | 6 g |

Each produced photopolymerizable composition was independently applied in a 2 μm thickness to a 100 μm-thick polyethylene terephthalate film and dried at 100° C. for 5 minutes. Further, the following coating solution (1) for a protective layer was applied in 1 μm-thickness to the resulting film and dried at 100° C. for 2 minutes to produce recording materials of Examples 1 to 7.

| Coating Solution for Protective Layer (1) | |
|---|---|
| Water | 98 g |
| polyvinyl alcohol | 1.7 g |
| hydroxypropylmethylcellulose | 1.7 g |
| polyvinylpyrrolidone | 8.7 g |

Comparative Examples 1 to 5

Recording materials of Comparative Examples 1 to 5 were produced in the same manner as Example 1, except that the organic dyes, the photoradical generating agents, and the thiol compounds were changed respectively as shown in Table 1. The thiol compounds used for Comparative Examples 1 to 5 were as follows.

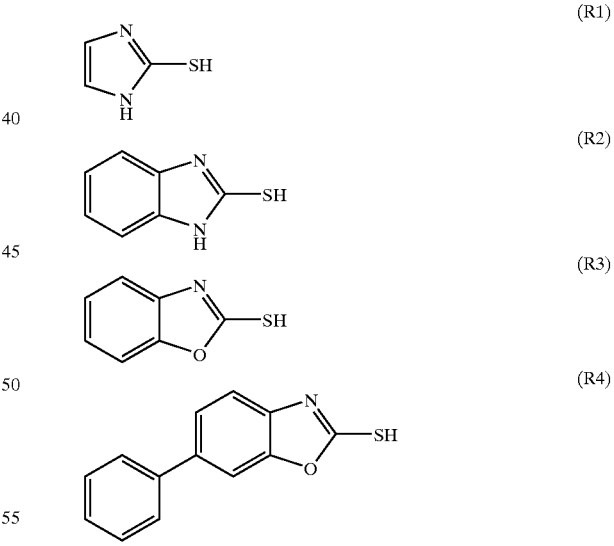

The recording materials produced by Examples 1 to 7 and Comparative Examples 1 to 5 were exposed by a vacuum printing frame apparatus. The exposure of the recording materials was carried out by radiating light for 10 seconds from a 500 W xenon lamp (manufactured by Ushio Inc.) through a step wedge [concentration step 0.15; the number of concentration steps 1 to 15; Fuji Step Guide P (trade name, manufactured by Fuji Photo Film Co., Ltd.) and SC 38 Filter (trade name, manufactured by Fuji Photo Film Co., Ltd., a sharp cut filter for cutting light with wavelength of 380 nm or shorter)]. After the exposure, the respective recording materials were developed by using a developing solution having the following composition.

| Developing Solution | |
|---|---|
| dehydrated sodium carbonate | 10 g |
| butyl cellosolve | 5 g |
| water | 1 l |

On completion of the development, since the exposure dose for the area corresponding to the higher step number of the step wedge was low, the photopolymerizable compositions in the area were eluted to the developing solution to expose the polyethylene terephthalate face. Regarding the recording materials of the respective examples, the areas from which the photopolymerizable compositions were completely eluted were investigated and the step number of the step wedge (the number of clear steps) corresponding to the areas where the exposure dose was highest was measured. The higher the measured number of steps, the higher the sensitivity of the recording materials. The results are shown in Table 1. In cases when the sensitivity was found to be low and the photopolymerizable compositions in all of the exposed areas were eluted to the developing solution, the term, "flow-out", is written in Table and in cases when the sensitivity was found to be high and the photopolymerizable compositions in all of the exposed areas were cured and remained even after the development, the term, "solid", is written in Table.

Further, after the above-mentioned recording materials were left for a day (accelerated period) under the conditions of 40° C. temperature and 90% humidity, exposure and development were carried out and the number of clear steps was measured in the same manner. The smaller the difference in the number of the steps from that immediately after the production, the better the raw storage property.

According to the results shown in Table 1, as compared with Comparative Examples 1 to 5, the recording materials of Examples 1 to 7 were found to be highly sensitive and to have excellent raw storage property as well.

Example 8

1. Preparation of Electron-donating Colorless Dye-encapsulating Solution

1.-a. Preparation of Electron-donating Colorless Dye (1)-encapsulating Solution 8.9 g of the following electron-donating colorless dye (1) was dissolved in 16.9 g of ethyl acetate and 20 g of enencapsulating agents (trade name: Takenate D-110N, manufactured by Takeda Chemical Industries, Ltd.) and 2 g of Millionate MR 200 (trade name, manufactured by Nippon Polyurethane Industry Co., Ltd.), were added. The resulting solution was added to a mixed solution of 42 g of 8% phthalated gelatin and 1.4 g of 10% sodium dodecylbenzenesulfonate solution and emulsified and dispersed at 20° C. to obtain an emulsion. To the obtained emulsion, 14 g of water and 72 g of an aqueous 2.9% tetraethylene pentamine solution were added and heated to 60° C. while being stirred to obtain a encapsulating solution enencapsulating the electron-donating colorless dye (1) in the core and having 0.5 μm average particle diameter of the capsules after 2 hours.

Electron-donating colorless dye (1)

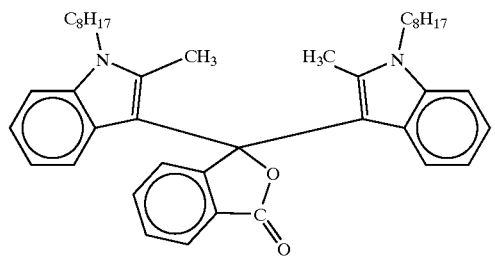

TABLE 1

| | Organic dye | Photoradical generating agent | Thiol compound | Number of clear steps [step] immediately after application | Number of clear steps [step] after accelerated period |
|---|---|---|---|---|---|
| Example 1 | (1) 0.04 g | (1) 0.20 g | (1) 0.03 g | 7 | 7 |
| Example 2 | (1) 0.04 g | (1) 0.20 g | (2) 0.03 g | 6 | 6 |
| Example 3 | (1) 0.04 g | (1) 0.20 g | (3) 0.03 g | 6 | 5 |
| Example 4 | (1) 0.04 g | (1) 0.20 g | (4) 0.03 g | 7 | 7 |
| Example 5 | (1) 0.04 g | (1) 0.20 g | (5) 0.03 g | 8 | 8 |
| Example 6 | (1) 0.04 g | (2) 0.12 g | (5) 0.03 g | 6 | 6 |
| Example 7 | (2) 0.03 g | (3) 0.12 g | (5) 0.03 g | 6 | 6 |
| Comparative example 1 | (1) 0.04 g | (1) 0.20 g | (R1) 0.03 g | 3 | flow-out |
| Comparative example 2 | (1) 0.04 g | (1) 0.20 g | (R2) 0.03 g | 4 | flow-out |
| Comparative example 3 | (1) 0.04 g | (1) 0.20 g | (R3) 0.03 g | 5 | flow-out |
| Comparative example 4 | (1) 0.04 g | (2) 0.12 g | (R2) 0.03 g | 4 | flow-out |
| Comparative example 5 | (2) 0.03 g | (3) 0.12 g | (R2) 0.03 g | 3 | flow-out |

2. Preparation of Emulsion of Photopolymerizable Composition 2-a. Preparation of Emulsion of Photopolymerizable Composition (8)

Organic dyes, photoradical generating agents, and thiol compounds respectively shown in Table 2 and 4.2 g of the following polymerizable electron-accepting compound (1) were mixed and stirred with and dissolved in 5.3 g of isopropyl acetate.

Polymerizable electron-accepting compound (1)

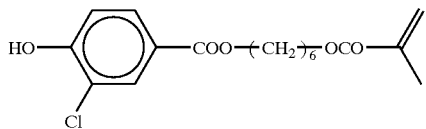

The obtained solution was added to a mixed solution of 13 g of an aqueous 8% gelatin solution, 0.8 g of an aqueous solution containing 2% of the following surfactant (1) and 0.8 g of an aqueous solution containing 2% of the following surfactant (2) and emulsified at 10,000 rpm for 5 minutes with a homogenizer (manufactured by Nippon Seiki Co., Ltd.) to obtain an emulsion of the photopolymerizable composition (8).

Surfactant (1)

$C_9H_{19}$—⟨phenyl⟩—$O(CH_2)_4SO_3Na$

Surfactant (2)

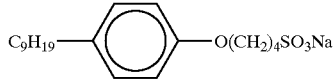

3. Preparation of Coating Solution for Recording Layer 3-a. Preparation of Coating Solution for Recording Layer (8)

4 g of the above-mentioned electron-donating colorless dye (1)-encapsulating solution, 12 g of the emulsion of the photopolymerizable composition (8), and 12 g of an aqueous 15% gelatin solution were mixed to prepare a coating solution for the recording layer (8).

4. Preparation of Coating Solution (2) for Protective Layer 4-a. Preparation of Coating Solution (2) for Protective Layer A coating solution (2) for a protective layer was prepared by mixing 4.5 g of an aqueous 10% gelatin solution, 4.5 g of distilled water, 0.5 g of an aqueous solution containing 2% following surfactant (3), 0.3 g of an aqueous solution containing 2% following surfactant (4), 0.5 g of an aqueous solution containing 2% following film-curing agent (1), colloidal silica (trade name: Syloid 72, manufactured by FUJI-DEVISON CHEMICAL LTD.) in a proper amount to be 50 mg/m² coating thickness, and 1 g of colloidal silica (trade name: Snowtex N, manufactured by Nissan Chemical Industries, Ltd.).

Surfactant (3)

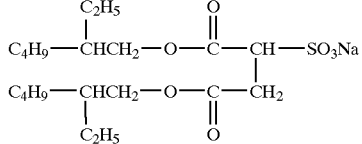

Surfactant (4)

$C_9H_{19}$—⟨phenyl⟩—$O\text{-}(CH_2CH_2O)_3\text{-}(CH_2)_4\text{-}SO_3Na$

Film-curing agent (1)

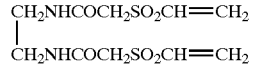

5. Substrate

A 100 μm-thick white polyester film filled with a white pigment (Lumirror E 68 L, trade name, manufactured by Toray Industries, Inc.) was used as a substrate. To the substrate, the above-mentioned coating solution (8) for a recording layer was applied by a coating bar so as to form a coating layer with a dried weight 6 g/m² and dried at 30° C. for 10 minutes. To the resulting substrate, the above-mentioned coating solution (2) for a protective layer was applied by a coating bar so as to form a coating layer with a dried weight 2 g/m² and dried at 30° C. for 10 minutes to obtain a recording material of Example 8.

Examples 9 to 14

Recording materials of Example 9 to Example 14 were produced in the same manner as Example 8, except that the organic dye, the photoradical generating agent, and the thiol compound used for Example 8 were changed to the organic dyes, the photoradical generating agents, and the thiol compounds, respectively shown in Table 2.

Comparative Examples 6 to 11

Recording materials of Comparative Examples 6 to 11 were produced in the same manner as Example 8, except that the organic dye, the photoradical generating agent, and the thiol compound used for Example 8 were changed to the organic dyes, the photoradical generating agents, and the thiol compounds, respectively shown in Table 2.

The produced recording materials of Examples 8 to 14 and Comparative Example 6 to Comparative Example 11 were exposed using a vacuum printing frame apparatus in the conditions of 24° C. temperature and 60% humidity by radiating light for 30 seconds from a 500 W xenon lamp (manufactured by Ushio Inc.) through the above-mentioned step wedge and SC 38 Filter to respectively form latent images. After the exposure, the respective recording materials were heated by a hot plate at 125° C. for 15 seconds to form a color generated at the time of reaction of the electron-donating colorless dye (1) and the polymerizable electron-accepting compound (1) in the un-exposed area and cause no coloration or decrease of the color density in the exposed area. Areas where no coloration took place were investigated and the step number of the step wedge (the number of clear steps) corresponding to the areas where the exposure dose was less was measured. The higher the measured number of steps, the higher the sensitivity of the recording materials. The results are shown in Table 2.

When the sensitivity was found to be high and the coloration did not take place in all of the steps, the term, "clear", is written in Table and in the case the sensitivity was found to be low and coloration took place in all of the steps, the term, "solid", is written in Table 2.

Further, after the above-mentioned recording materials were left for about 1 hour under the conditions of 24° C. temperature and 20% humidity, exposure and development were carried out in the same manner under the same conditions and the number of clear steps was measured. The smaller the difference of the number of the steps from the number of steps under the conditions of 24° C. temperature and 60% humidity, the better the humidity dependency.

Further, after the above-mentioned recording materials were left for a day under the conditions of 40° C. temperature and 90% humidity, exposure and heating were carried out and the number of clear steps was measured in the same manner under 24° C. temperature and 60% humidity. The smaller the difference of the number of the steps from the number of steps immediately after the production, the better the raw storage property.

TABLE 2

| | Organic dye | Photoradical generating agent | Thiol compound | Number of clear steps immediately after application/24° C. and 60% humidity | Number of clear steps immediately after application/24° C. and 20% humidity | Number of clear steps after accelerated period/24° C. and 60% humidity |
|---|---|---|---|---|---|---|
| Example 8 | (1) 0.11 g | (1) 0.75 g | (1) 0.17 g | 7 | 7 | 7 |
| Example 9 | (1) 0.11 g | (1) 0.75 g | (2) 0.17 g | 7 | 7 | 7 |
| Example 10 | (1) 0.11 g | (1) 0.75 g | (3) 0.17 g | 7 | 6 | 7 |
| Example 11 | (1) 0.11 g | (1) 0.75 g | (4) 0.17 g | 8 | 8 | 8 |
| Example 12 | (1) 0.11 g | (1) 0.75 g | (5) 0.17 g | 9 | 9 | 9 |
| Example 13 | (1) 0.11 g | (2) 0.25 g | (5) 0.17 g | 7 | 7 | 7 |
| Example 14 | (2) 0.05 g | (3) 0.25 g | (5) 0.17 g | 6 | 6 | 6 |
| Comparative Example 6 | (1) 0.11 g | (1) 0.75 g | (R1) 0.17 g | 2 | solid | solid |
| Comparative Example 7 | (1) 0.11 g | (1) 0.75 g | (R2) 0.17 g | 3 | solid | solid |
| Comparative Example 8 | (1) 0.11 g | (1) 0.75 g | (R3) 0.17 g | 4 | solid | solid |
| Comparative Example 9 | (1) 0.11 g | (1) 0.75 g | (R4) 0.17 g | 5 | 4 | solid |
| Comparative Example 10 | (1) 0.11 g | (2) 0.25 g | (R2) 0.17 g | 3 | solid | solid |
| Comparative Example 11 | (2) 0.05 g | (3) 0.25 g | (R2) 0.17 g | 3 | solid | solid |

According to the results shown in Table 2, as compared with Comparative Examples 6 to 11, the recording materials of Examples 8 to 14 were found to be highly sensitive and to have excellent raw storage property and humidity dependency as well.

According to the invention, a photopolymerizable composition sensitive with a high sensitivity to not only UV rays but also to light from visible light rays to IR rays and having excellent raw storage property can be provided.

Further, the invention can provide a recording material, which is capable of carrying out image recording with a high sensitivity to not only UV rays but also to light from visible light rays to IR rays and has excellent raw storage property and humidity dependency, in a waste-free and completely dry processing system that does not need to use developing solution.

What is claimed is:

1. A photopolymerizable composition comprising (a) a polymerizable compound including an ethylenic unsaturated bond, (b) a photoradical generating agent, and (c) a thiol compound represented by the following formula (II):

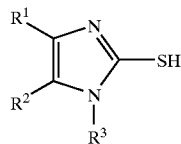

wherein, each of $R^1$ and $R^2$ independently represents one of hydrogen atom, an alkyl, which may have substituents, and an aryl, which may have substituents; the alkly and the aryl may be bonded to each other to form a ring; and $R^3$ represents one of an alkyl with 2 to 20 carbon atoms and an aryl either of which may include a substituent.

2. The photopolymerizable composition according to claim 1, wherein the composition comprises, as a photoradical generating agent, at least one compound selected from a group consisting of organic boron compounds, lophin dimer compounds, trihalomethyl compounds, azinium salt compounds, and acylphosphine oxide compounds.

3. The photopolymerizable composition according to claim 2, wherein the organic boron compound is represented by the following general formula (A):

General formula (A)

wherein, each of $R_a^1$, $R_a^2$, $R_a^3$, and $R_a^4$ independently represents one of an aliphathic group, an aromatic group, a heterocyclic group and $Si(R_a^5)(R_a^6)$—$R_a^7$; each of $R_a^5$, $R_a^6$, and $R_a^7$ independently represents one of an aliphatic group and an aromatic group; and G+ represents a group that can form a cation.

4. A recording material comprising a recording layer on a substrate, wherein the recording layer comprises a photopolymerizable composition comprising (a) a polymerizable compound including an ethylenic unsaturated bond, (b) a photoradical generating agent, (c) a thiol compound represented by the following formula (II):

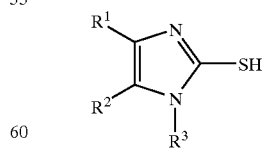

wherein, each of $R^1$ and $R^2$ independently represents one of hydrogen atom, an alkyl, which may have substituents, and an aryl, which may have substituents; the alkly and the aryl may be bonded to each other to form a ring; and $R^3$ represents one of an alkyl with 2 to 20 carbon atoms and an aryl either of which may include a substituent.

5. The recording material according to claim 4, wherein the recording layer further comprises a color-forming component A and a color-forming component B, which includes a site for forming a color by reacting with the color-forming component A.

6. The recording material according to claim 5, wherein the color-forming component B comprises at least one polymerizable compound, which includes an ethylenic unsaturated bond.

7. The recording material according to claim 6, wherein the polymerizable compound, which includes an ethylenic unsaturated bond is a color formation suppressing compound including a site for suppressing the reaction of the color-forming components A and B in a single molecule.

8. The recording material according to claim 5, wherein the color-forming component A is encapsulated in a microcapsule.

9. The recording material according to claim 6, wherein the color-forming component A is encapsulated in a microcapsule.

10. The recording material according to claim 7, wherein the color-forming component A is encapsulated in a microcapsule.

11. The recording material according to claim 4, comprising a multi-layer structure comprising a first recording layer photosensitive to light with a center wavelength of $\lambda_1$ and forming a color, a second recording layer photosensitive to light with a center wavelength of $\lambda_2$ and forming a color different from that of the first recording layer, . . . and an ith recording layer photosensitive to light with a center wavelength of $\lambda_i$ and forming a color different from those of the first, the second, . . . , (i–1)th recording layers.

12. The recording material according to claim 5, comprising a multi-layer structure comprising a first recording layer photosensitive to light with a center wavelength of $\lambda 1$ and forming a color, a second recording layer photosensitive to light with a center wavelength of $\lambda_2$ and forming a color different from that of the first recording layer, . . . and an ith recording layer photosensitive to light with a center wavelength of $\lambda_1$ and forming a color different from those of the first, the second, . . . , (i–1)th recording layers.

* * * * *